(12) United States Patent
Oishi

(10) Patent No.: US 11,598,807 B2
(45) Date of Patent: Mar. 7, 2023

(54) TEST SYSTEM AND PROBE DEVICE

(71) Applicant: Kioxia Corporation, Tokyo (JP)

(72) Inventor: Masayuki Oishi, Mie (JP)

(73) Assignee: Kioxia Corporation, Tokyo (JP)

( * ) Notice: Subject to any disclaimer, the term of this patent is extended or adjusted under 35 U.S.C. 154(b) by 152 days.

(21) Appl. No.: 17/176,619

(22) Filed: Feb. 16, 2021

(65) Prior Publication Data

US 2022/0082622 A1  Mar. 17, 2022

(30) Foreign Application Priority Data

Sep. 14, 2020 (JP) .............................. JP2020-154164

(51) Int. Cl.
    *G01R 31/3185* (2006.01)
    *G01R 21/00* (2006.01)
    *G01R 23/00* (2006.01)

(52) U.S. Cl.
    CPC ............... *G01R 31/318511* (2013.01); *G01R 31/318513* (2013.01)

(58) Field of Classification Search
    CPC ........... H01L 22/20; H01L 2225/06541; H01L 22/34
    See application file for complete search history.

(56) References Cited

U.S. PATENT DOCUMENTS

| | | | |
|---|---|---|---|
| 6,651,204 B1 | 11/2003 | Rajsuman et al. | |
| 7,869,240 B2 | 1/2011 | Shimizu et al. | |
| 8,179,730 B2 | 5/2012 | Shimizu et al. | |
| 9,194,885 B2 | 11/2015 | Kanev et al. | |
| 2001/0026949 A1* | 10/2001 | Ogawa | H01L 22/20 324/759.02 |
| 2001/0047496 A1* | 11/2001 | Hidaka | G11C 29/48 714/5.1 |
| 2008/0252330 A1* | 10/2008 | Hart | H01L 22/20 257/E21.525 |
| 2011/0156284 A1* | 6/2011 | Zhang | H01L 22/14 257/E23.179 |

(Continued)

FOREIGN PATENT DOCUMENTS

| | | |
|---|---|---|
| JP | 2009-3991 A | 1/2009 |
| JP | 4330287 B2 | 9/2009 |
| JP | 5613333 B2 | 10/2014 |

*Primary Examiner* — Jermele M Hollington
*Assistant Examiner* — Temilade S Rhodes-Vivour
(74) *Attorney, Agent, or Firm* — Oblon, McClelland, Maier & Neustadt, L.L.P.

(57) ABSTRACT

A test system of embodiments electrically connects one or more first semiconductor chips formed on a first wafer and one or more second semiconductor chips formed on a second wafer to perform tests on the one or more first and second semiconductor chips. The test system includes a test device that supplies a test signal to each of the one or more first semiconductor chips, a first probe device including a first probe to be connected to a first internal pad of each of the one or more first semiconductor chips and a first communication circuit configured to transmit and receive a signal, and a second probe device including a second probe to be connected to a second internal pad of each of the one or more second semiconductor chips and a second communication circuit configured to transmit and receive the signal to and from the first communication circuit.

19 Claims, 17 Drawing Sheets

(56) References Cited

U.S. PATENT DOCUMENTS

2012/0168964 A1* 7/2012 Kim .................. G01R 1/07307
  257/E21.531
2015/0037914 A1* 2/2015 Takahashi ............... H01L 22/14
  438/15

* cited by examiner

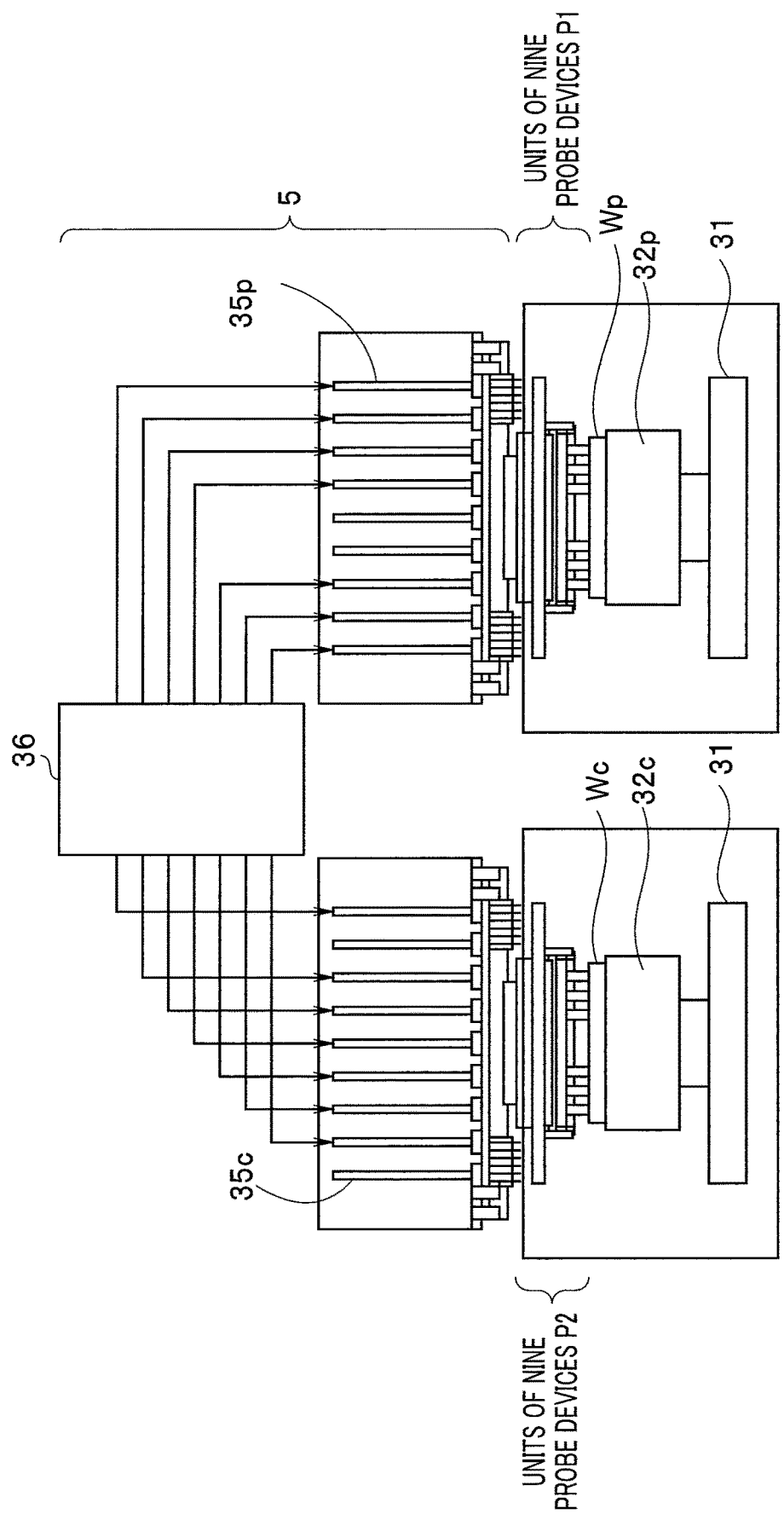

TEST SYSTEM AND PROBE DEVICE

CROSS-REFERENCE TO RELATED APPLICATION

This application is based upon and claims the benefit of priority from the prior Japanese Patent Application No. 2020-154164 filed in Japan on Sep. 14, 2020; the entire contents of which are incorporated herein by reference.

FIELD

Embodiments described herein relate generally to a test system and a probe device.

BACKGROUND

A test period of a wafer test of a semiconductor storage device tends to increase in proportion to increase of storage capacity. The semiconductor storage device has a structure in which a memory cell and a peripheral circuit are assembled. The peripheral circuit, in which a pump circuit which generates a voltage and a test circuit (BIST (build in self test)) are incorporated, can perform a test of the memory cell of the semiconductor storage device.

By the way, to increase speed of a peripheral circuit, a technique called a CBA (CMOS directly bonded to array) has been developed in which a memory cell and a peripheral circuit are manufactured on different wafers through different processes and the memory cell and the peripheral circuit are assembled after manufacturing. In the CBA, the memory cell and the peripheral circuit are formed on different wafers, and thus, in a case where a test is performed on a memory cell alone, it is necessary to implement functions similar to those of the peripheral circuit at a test device which performs a wafer test.

This makes a circuit configuration of the test device complicated, brings increase in cost and requires tests to be separately performed on the memory cell and the peripheral circuit, which makes a test period longer.

Further, a test can be performed by utilizing a peripheral circuit after a wafer on which a memory cell is formed and a wafer on which the peripheral circuit is formed are pasted to each other. However, in this case, even in a case where one of chips which are pasted to each other is a non-defective item, there is a case where the other may be a defective item, which may degrade a yield ratio.

BRIEF DESCRIPTION OF THE DRAWINGS

FIG. 19 is an explanatory diagram for explaining an aspect where tests are performed on a plurality of sets of the peripheral circuit chips Cp and the memory cell chips Cc at the same time.

DETAILED DESCRIPTION

A test system of the embodiments is a test system which electrically connects one or more first semiconductor chips formed on a first wafer and one or more second semiconductor chips formed on a second wafer to test the one or more first semiconductor chips and the one or more second semiconductor chips, the test system including a test device configured to supply a test signal to each of the one or more first semiconductor chips, at least one first probe device including a first probe to be connected to at least one first internal pad of each of the one or more first semiconductor chips and a first communication circuit configured to transmit and receive a signal, and at least one second probe device including a second probe to be connected to at least one second internal pad of each of the one or more second semiconductor chips and a second communication circuit configured to transmit and receive the signal to and from the first communication circuit.

Embodiments of the present invention will be described in detail below with reference to the drawings.

First Embodiment

Figure 1:
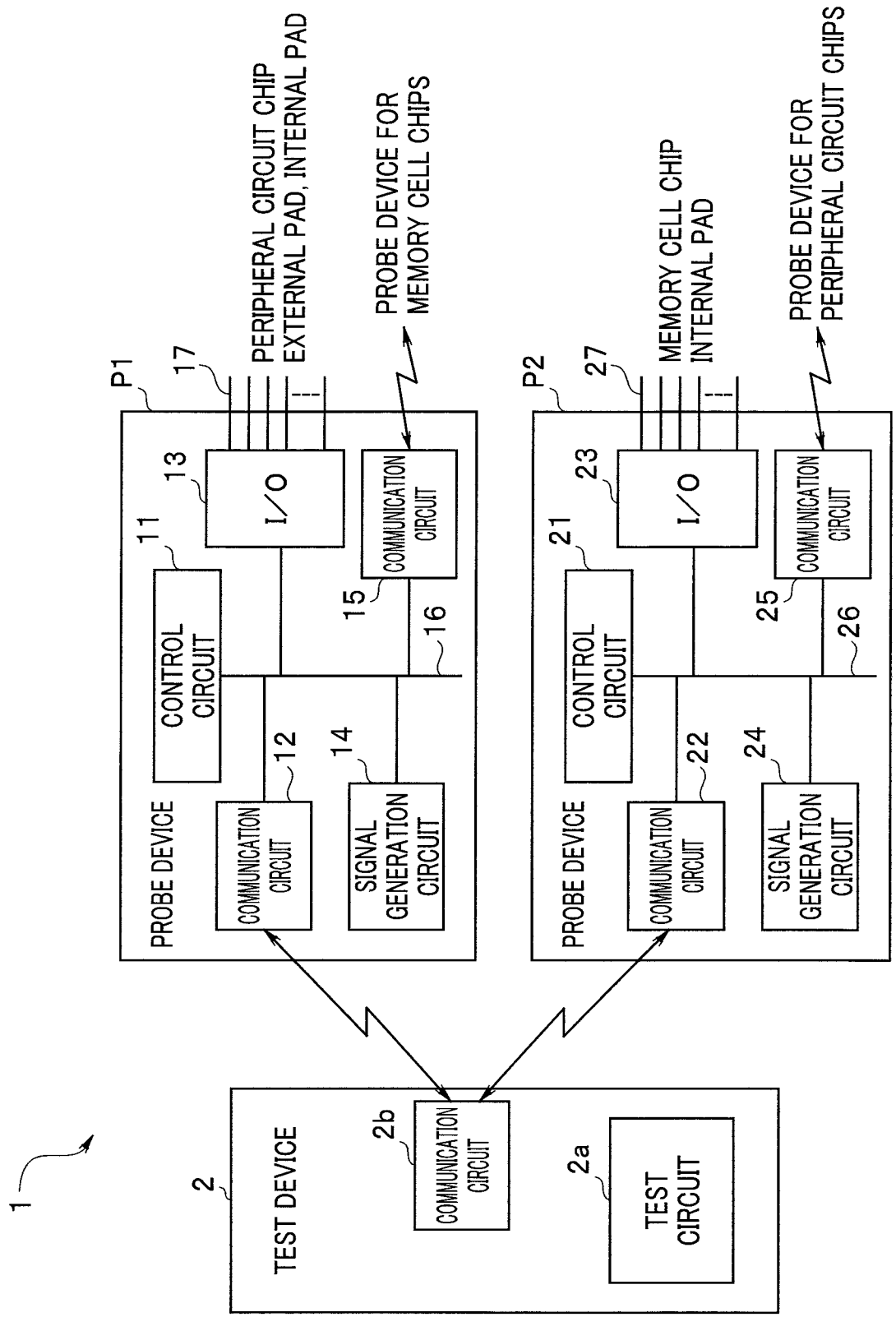
FIG. 1 is a block diagram illustrating a test system according to an embodiment.

FIG. 1 is a block diagram illustrating a test system according to an embodiment.

The present embodiment enables communication between probe devices and enables inspection to be performed on two semiconductor chips which are formed on different wafers and which relate to each other at the same time, to thereby shorten a wafer test period and improve a yield ratio.

Note that while an example of a wafer test of a semiconductor storage device will be described in the present embodiment, the present invention can be used in wafer tests of various kinds of semiconductor devices as well as the wafer test of the storage device.

In FIG. 1, a test system 1 includes a test device 2 and a plurality of probe devices P1 and P2 (hereinafter, referred to as a probe device P in a case where it is not necessary to distinguish between these). Note that while FIG. 1 illustrates only two probe devices P1 and P2, three or more probe devices may be employed.

A target to be tested by the test system 1 is, for example, two semiconductor chips constituted with a CBA, that is, a peripheral circuit chip Cp on which a peripheral circuit is constituted, and a memory cell chip Cc on which a memory cell is constituted. The test system 1 performs tests on the peripheral circuit chip Cp and the memory cell chip Cc constituted on respective wafers.

The probe device P1 is a device (probe card) for the peripheral circuit chip Cp, and the probe device P2 is a device (probe card) for the memory cell chip Cc. The probe device P has a role of electrically connecting a pad (PAD) on the semiconductor chip formed on the wafer and the test device 2. Note that the probe device P1 is different from the probe device P2 in the number of probes which corresponds to the number of pads of the semiconductor chips to be connected. It is therefore also possible to use the same device as the probe device P1 and the probe device P2 by avoiding using part of the probes.

The test device 2 includes a test circuit 2a and a communication circuit 2b. The test circuit 2a can generate various kinds of signals (test signals) for wafer tests of the peripheral circuit chip Cp and the memory cell chip Cc which constitute the semiconductor storage device to be inspected. The test circuit 2a obtains test determination results as to whether the peripheral circuit chip Cp and the memory cell chip Cc are non-defective or defective by capturing output signals from the peripheral circuit chip Cp and the memory cell chip Cc with respect to the generated test signal and comparing the output signals with an expected value.

The communication circuit 2b transmits and receives a signal through communication with the probe device P. The communication circuit 2b can perform communication in a wireless manner or in a wired manner. For example, the communication circuit 2b can perform communication by utilizing a wired transmission path which employs a wired cable such as a LAN and a wireless transmission path using optical communication, a wireless LAN, or the like. Note that a transmission path to be utilized by the communication circuit 2b is not limited to these. The communication circuit 2b transmits a test signal generated by the test circuit 2a to the probe device P, receives output of the probe device P and provides the output to the test circuit 2a.

The probe device P1 includes a control circuit 11 which controls respective units of the probe device P1. The control circuit 11 may be constituted with a processor using a CPU (central processing unit), an FPGA (field programmable gate array), or the like, and may control the respective units by operating in accordance with a program stored in a memory which is not illustrated or may implement part or all of functions with a hardware electronic circuit.

A communication circuit 12 transmits and receives a signal by performing communication with the communication circuit 2b of the test device 2. The communication circuit 12 can perform communication while complying with communication standards which are the same as those of the communication circuit 2b via a transmission path which is the same as a transmission path used by the communication circuit 2b.

An interface (I/O) 13 is provided at the probe device P1. The I/O 13 generates a signal and a voltage (hereinafter, these may be simply referred to as a signal) to be supplied to the peripheral circuit chip Cp and supplies the signal and the voltage to the probe 17 under control by the control circuit 11. The probe 17 is electrically connected to an external pad and an internal pad which will be described later, of the peripheral circuit chip Cp, supplies the signal and the voltage generated by the I/O 13 to the pads, captures a signal and a voltage occurring on the pads and provides the signal and the voltage to the I/O 13.

A communication circuit 15 transmits and receives a signal by performing communication with another probe device P (the probe device P2 in FIG. 1). The communication circuit 15 can perform communication in a wireless manner or in a wired manner. For example, the communication circuit 15 can perform communication by utilizing a wired transmission path which employs a wired cable such as a LAN and a wireless transmission path using optical communication, a wireless LAN, or the like. Note that a transmission path to be utilized by the communication circuit 15 is not limited to these.

A signal generation circuit 14 receives the signal and the voltage acquired via the probe 17 from the internal pad of the peripheral circuit chip Cp at the I/O 13 and generates a signal for enabling the communication circuit 15 to transmit the signal and the voltage to another probe device P (the probe device P2 in FIG. 1). The signal generation circuit 14 supplies the signal to the communication circuit 15, and the communication circuit 15 transfers the signal to another probe device P2 via a transmission path which is not illustrated.

The communication circuit 15 may be constituted so as to be able to digital transmit a signal or may be constituted so as to be able to analog transmit a signal. The signal which can be transmitted by the communication circuit 15 is generated at the signal generation circuit 14. For example, the communication circuit 15 may be constituted to directly analog transmit a voltage value. Alternatively, the communication circuit 15 may transmit digital information of a voltage value or may analog transmit a voltage waveform. In this case, a semiconductor chip side which has received the digital information and the analog signal generates a voltage.

Note that respective units inside the probe device P1 are connected with a bus 16.

Configurations of a control circuit 21, a communication circuit 22, an I/O 23, a signal generation circuit 24, a communication circuit 25, a bus 26 and a probe 27 of the probe device P2 are similar to configurations of the control circuit 11, the communication circuit 12, the I/O 13, the signal generation circuit 14, the communication circuit 15, the bus 16 and the probe 17 of the probe device P1 except the number of probes.

Figure 2:
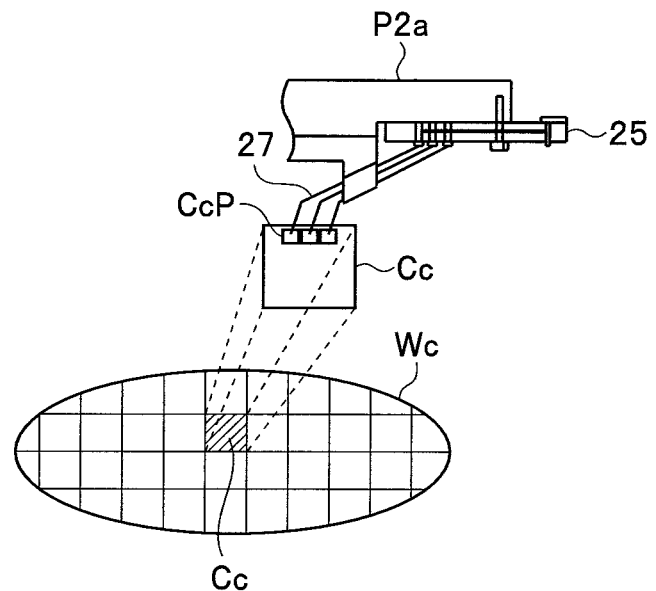
FIG. 2 is an explanatory diagram illustrating an example of appearance of a probe device P.
Figure 3:
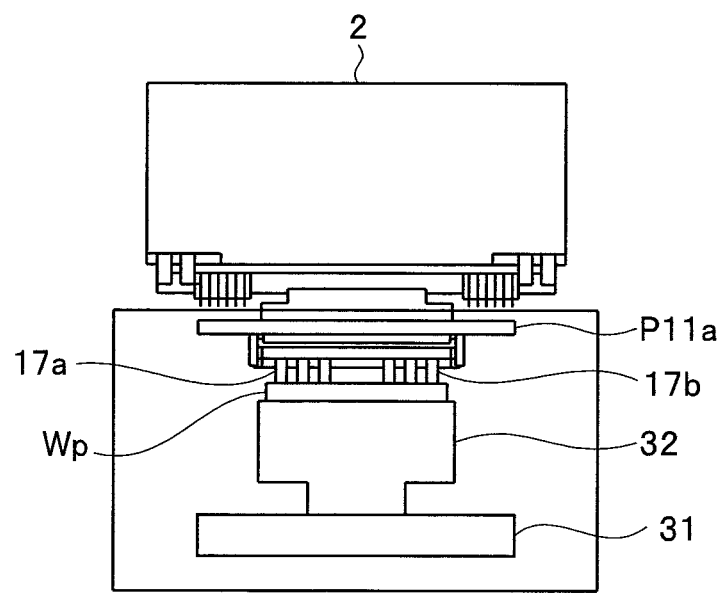
FIG. 3 is an explanatory diagram illustrating an example of the appearance of the probe device P.
Figure 4:
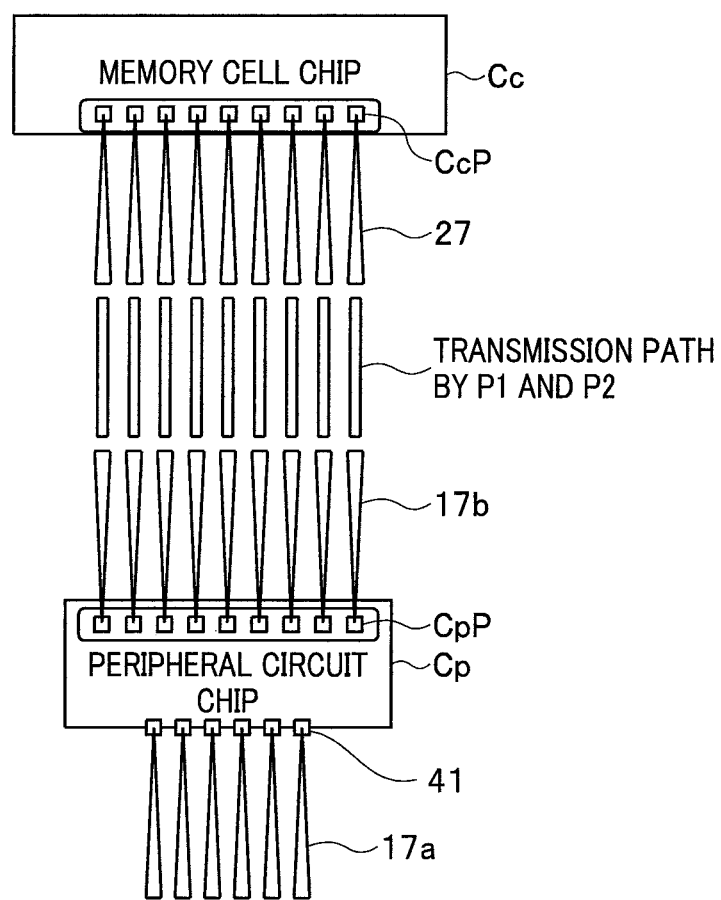
FIG. 4 is an explanatory diagram for explaining connection between the probe device P and respective semiconductor chips.

FIG. 2 and FIG. 3 are explanatory diagrams illustrating an example of appearance of the probe device P, and FIG. 4 is an explanatory diagram for explaining connection between the probe device P and respective semiconductor chips. Note that while FIG. 2 illustrates an aspect of connection between the probe device P2 and the memory cell chip Cc, and FIG. 3 illustrates an aspect of connection between the probe device P1 and the peripheral circuit chip Cp, the probe device P1 and the probe device P2 may have the same appearance and structure, and the probe device P2 in FIG. 2 may be connected to the peripheral circuit chip Cp, and the probe device P1 in FIG. 3 may be connected to the memory cell chip Cc.

FIG. 2 illustrates an example of a portion of appearance of the probe device P2. The probe device P2 has a chassis P2a, inside of which a substrate which is not illustrated is disposed, and respective circuit blocks in FIG. 1 are constituted on the substrate. A plurality of memory cell chips Cc which are to be tested at one time are formed on a wafer We for memory cells. During a test, a relative position between the chassis P2a and the wafer We are adjusted, so that the probe 27 which projects from the chassis P2a is brought into contact with the internal pad CcP of each memory cell chip Cc at a predetermined position (shaded area) on the wafer We. This achieves electrical connection between each memory cell chip Cc and the test device 2 via the probe device P2. Note that FIG. 2 illustrates an enlarged view of one memory cell chip Cc and illustrates an aspect where the probe 27 is in contact with the internal pad CcP.

Further, FIG. 3 illustrates another example of appearance of the probe device P. The probe device P1 has a chassis P11a, inside of which a substrate which is not illustrated is disposed, and respective circuit blocks in FIG. 1 are constituted on the substrate. A stage 32 is attached on the wafer prober 31, and a wafer Wp for peripheral circuits is mounted on the stage 32. A plurality of peripheral circuit chips Cp are formed on the wafer Wp. The wafer prober 31 carries the wafer Wp to transfer the wafer Wp to a determined position for the wafer Wp. This achieves electrical connection between the probe 17 of the probe device P1 and an external pad 41 (see FIG. 4) and an internal pad CpP on the peripheral circuit chip Cp. Note that the probe 17 of the probe device P1 to be connected to the external pad 41 will be referred to as a probe 17a, and the probe 17 of the probe device P1 to be connected to the internal pad CpP will be referred to as a probe 17b. The peripheral circuit chip Cp and the test device 2 are electrically connected to each other via the probe device P1 in this manner.

In the example in FIG. 3, the probe device P1 is attached to the test device 2 and is electrically connected to the test device 2. In a case where communication between the probe device P and the test device 2 is performed in a wireless manner, or in a case where communication between the probe device P and the test device 2 is performed in a wired manner using a transmission cable, it is possible to dispose the probe device P and the test device 2 at separate positions.

Note that the peripheral circuit chip Cp and the memory cell chip Cc can constitute one semiconductor storage device by, for example, making the wafer Wp face the wafer Wc, connecting the internal pad CpP of each peripheral circuit chip Cp to the internal pad CcP of each memory cell chip Cc and pasting the wafer Wp and the wafer We by a CBA.

In FIG. 4, the peripheral circuit chip Cp includes an internal pad CpP and an external pad 41, and the memory cell chip Cc includes only an internal pad CcP. When the semiconductor storage device is completed, the internal pad CpP of the peripheral circuit chip Cp is electrically connected to the internal pad CcP of the memory cell chip Cc, and the external pad 41 functions as a terminal for transmitting and receiving a signal and a voltage to and from outside of the semiconductor storage device.

The probe 17a and the probe 17b of the probe device P1 are respectively connected to the external pad 41 and the internal pad CpP of the peripheral circuit chip Cp on the wafer Wp. Further, the probe 27 of the probe device P2 is connected to the internal pad CcP of the memory cell chip Cc.

The probe 17b and the probe 27 are electrically connected to each other by way of circuits inside the probe device P1, transmission paths by the probe devices P1 and P2, and circuits inside the probe device P2. This achieves electrical connection between the peripheral circuit chip Cp and the memory cell chip Cc via the probe devices P1 and P2.

Figure 5:
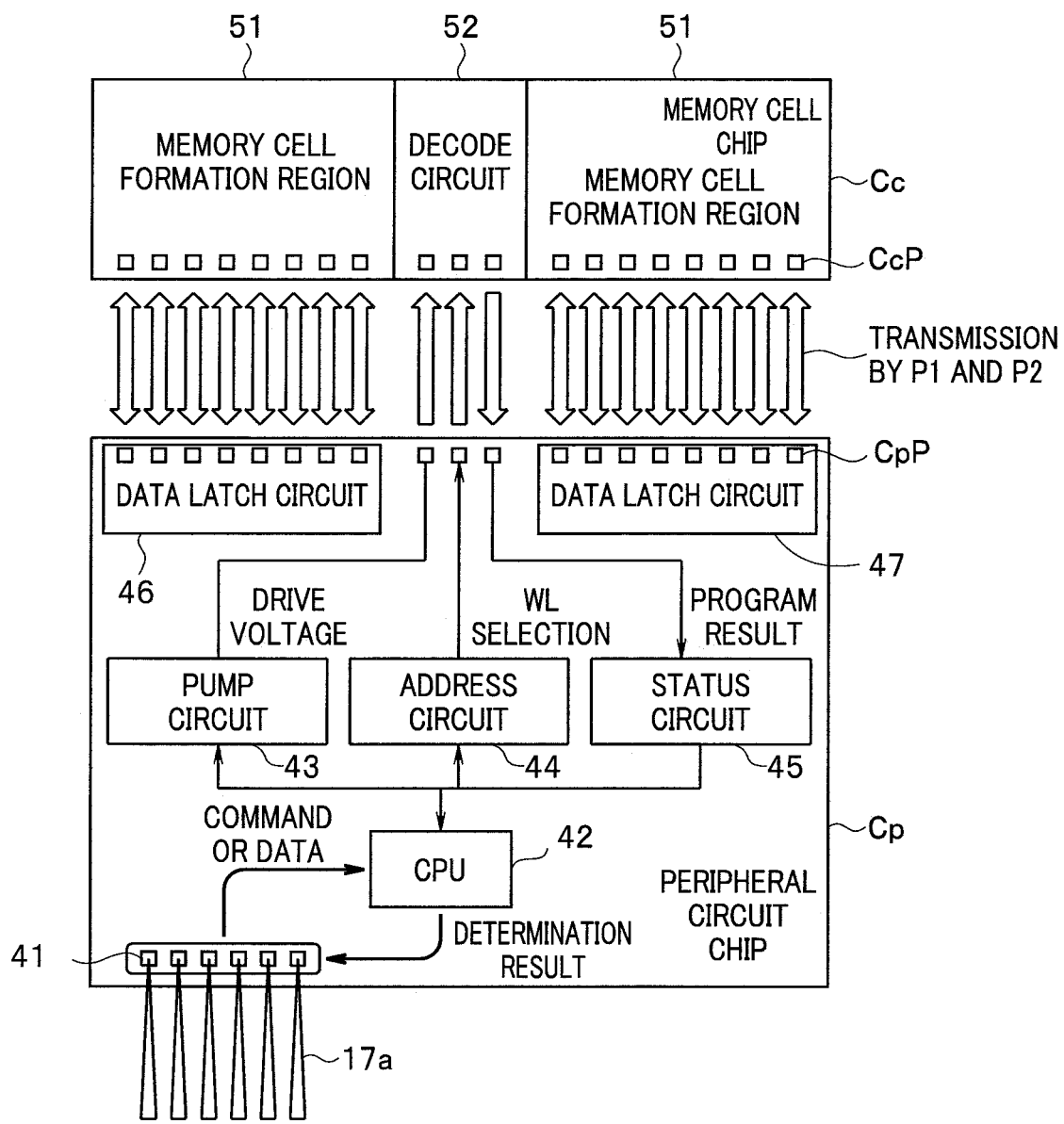
FIG. 5 is a block diagram illustrating a circuit portion which involves a wafer test inside a peripheral circuit chip Cp and a memory cell chip Cc.

FIG. 5 is a block diagram illustrating a circuit portion which involves a wafer test inside the peripheral circuit chip Cp and the memory cell chip Cc.

A CPU 42, a pump circuit 43 which is a voltage generation circuit, an address circuit 44, a status circuit 45 and data latch circuits 46 and 47 are formed on the peripheral circuit chip Cp. The CPU 42 controls the whole of the peripheral circuit chip Cp regarding a wafer test using a memory which is not illustrated. The CPU 42 captures a test signal such as a command and various kinds of data input from the probe 17a of the probe device P1 via the external pad 41 and controls the pump circuit 43 and the address circuit 44 in accordance with the captured test signal.

The pump circuit 43 generates a drive voltage in accordance with the test signal and outputs the drive voltage to the internal pad CpP. Further, the address circuit 44 generates an address in accordance with the test signal and outputs the address to the internal pad CpP. For example, the address circuit 44 outputs an address for selecting a word line WL to the internal pad CpP. Further, the CPU 42 sets data at the data latch circuits 46 and 47 based on the test signal. The data latch circuits 46 and 47 output the captured data to a plurality of internal pads CpP.

Each internal pad CpP of the peripheral circuit chip Cp is connected to the probe 17b of the probe device P1, and a signal supplied to the internal pad CpP based on the test signal is transmitted to the probe 27 of the probe device P2 by way of the probe 17b of the probe device P1. The probe 27 is connected to each internal pad CcP of the memory cell chip Cc, and each internal pad CcP receives a signal from each internal pad CpP of the peripheral circuit chip Cp via the probe 27.

The memory cell chip Cc includes a memory cell formation region 51 in which a memory cell is to be formed, and a decode circuit 52. The decode circuit 52 receives output of the pump circuit 43 and the address circuit 44 of the peripheral circuit chip Cp via the internal pad CcP. The decode circuit 52 decodes the input signal to obtain a signal for driving each memory cell in the memory cell formation region 51.

Note that the memory cell chip Cc may include a CPU and a memory for controlling a wafer test.

For example, during readout of data, or the like, output from each memory cell in the memory cell formation region 51 is provided to the internal pad CcP. A signal supplied to the internal pad CcP is transmitted to the probe 17b of the probe device P1 from the probe 27 via the probe devices P1 and P2. Each internal pad CpP of the peripheral circuit chip Cp receives the signal from each internal pad CcP of the memory cell chip Cc and provides the signal to the data latch circuits 46 and 47 in this manner.

Further, the decode circuit 52 generates status information as to whether or not the memory cell chip Cc is driven in accordance with a command. The information is supplied to the status circuit 45 via the internal pad CcP, the probe devices P1 and P2 and the internal pad CpP. For example, during program operation on the memory cell, a program result is transmitted as the status information. The status circuit 45 provides the status information to the CPU 42, and the CPU 42 outputs a determination result of the wafer test to the external pad 41 based on the status information. The determination result is supplied from the external pad 41 to the probe device P1 via the probe 17a.

Figure 6:
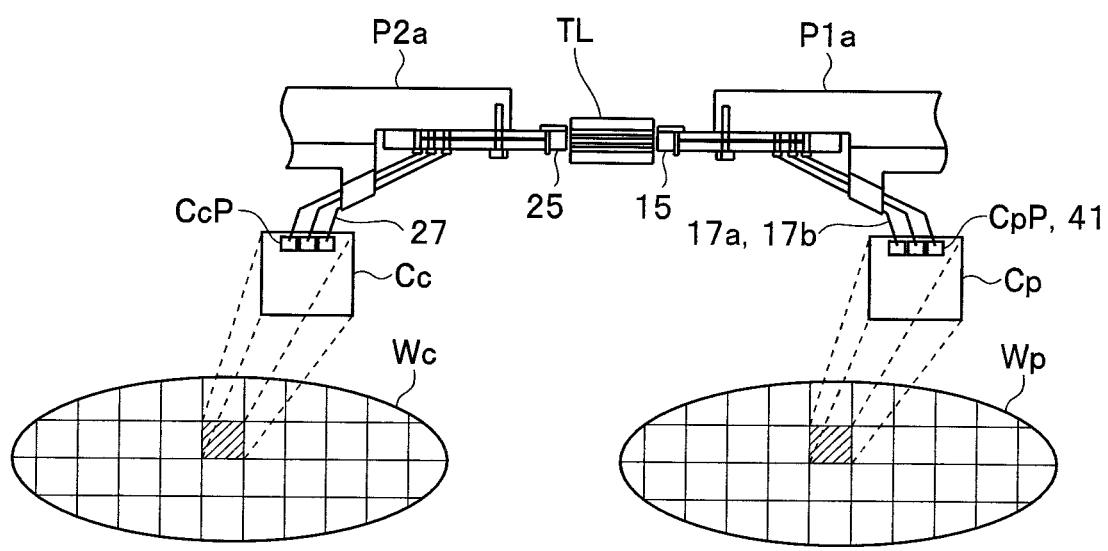
FIG. 6 is an explanatory diagram illustrating an aspect of a wafer test.

Operation of the embodiment configured in this manner will be described next with reference to FIG. 6 to FIG. 12. FIG. 6 is an explanatory diagram illustrating an aspect of a wafer test. Further, FIG. 7 to FIG. 12 are explanatory diagrams for explaining transmission of a signal during a wafer test. In FIG. 6, the same reference numerals will be assigned to components which are the same as the components in FIG. 2, and description will be omitted.

As illustrated in FIG. 6, in the present embodiment, wafer tests are performed at the same time on the peripheral circuit chip Cp and the memory cell chip Cc before the peripheral circuit chip Cp and the memory cell chip Cc are pasted together by connecting the probe device P1 to the peripheral circuit chip Cp formed on the wafer Wp and connecting the probe device P2 to the memory cell chip Cc formed on the wafer Wc.

The chassis P1a has the same configuration as the configuration of the chassis P2a, and respective circuit blocks constituting the probe device P1 are constituted on a substrate which is disposed inside the chassis P1a and which is not illustrated. Upon a wafer test, a relative position between the chassis P1a and the wafer Wp is adjusted, so that the probes 17a and 17b projecting from the chassis P1a are respectively brought into contact with the external pad 41 and the internal pad CpP of the peripheral circuit chip Cp at a predetermined position (shaded area) on the wafer Wp. Further, a relative position between the chassis P2a and the wafer Wc is adjusted, so that the probe 27 projecting from the chassis P2a is brought into contact with the internal pad CcP of the memory cell chip Cc at a predetermined position (shaded area) on the wafer Wc. By this means, the peripheral circuit chip Cp and the memory cell chip Cc are electrically connected to each other via the probe devices P1 and P2 and are also electrically connected to the test device 2.

The communication circuit 12 and the communication circuit 22 of the probe devices P1 and P2 receive a signal from the test device 2. The control circuit 11 of the probe device P1 provides the test signal from the test device 2 to the I/O 13, and the I/O 13 provides the test signal to the external pad 41 of the peripheral circuit chip Cp via the probe 17a. The peripheral circuit chip Cp generates various kinds of signals, or the like, for driving the memory cell chip Cc based on the test signal from the external pad 41 and outputs the signals, or the like, from the internal pad CpP.

In the present embodiment, the I/O 13 captures output of the internal pad CpP via the probe 17b of the probe device P1. The signal generation circuit 14 converts a form of the signal captured by the I/O 13 into a form appropriate for communication by the communication circuit 15 and the communication circuit 25 and provides the converted signal to the communication circuit 15. The communication circuit 15 transmits the signal from the signal generation circuit 14 to the communication circuit 25 of the probe device P2 via a transmission path TL.

The signal generation circuit 24 of the probe device P2 returns the form of the signal from the communication circuit 25 into an original form and provides the signal to the I/O 23 under control by the control circuit 21. The I/O 23 provides the signal from the peripheral circuit chip Cp to the internal pad CcP of the memory cell chip Cc via the probe 27. The memory cell chip Cc operates based on the test signal from the test device 2 in this manner.

For example, in a case where it is instructed to perform write by the test signal, the memory cell chip Cc performs write in the memory cell, and outputs status information as to whether or not write is normally performed via the internal pad CcP. The status information is transmitted from the probe 27 to the probe device P2 and transmitted from the probe device P2 to the probe device P1 via the transmission path TL. Note that also in this case, the status information is transmitted after a form of the status information is converted into a form appropriate for communication by the communication circuits 25 and 15. In other words, the signal generation circuit 24 of the probe device P2 provides the status information to the communication circuit 25 after converting a form of the status information into a form of a signal appropriate for communication by the communication circuits 25 and 15. The probe device P1 outputs the status information to the internal pad CpP of the peripheral circuit chip Cp via the probe 17b after returning the form of the signal transmitted from the communication circuit 25 into the original form at the signal generation circuit 14. The peripheral circuit chip Cp outputs the status information to the probe device P1 from the external pad 41 via the probe 17a. The probe device P1 transmits the received status information to the test device 2.

In this manner, the present embodiment enables communication between the probe devices P1 and P2 to thereby enable relay of a signal between the peripheral circuit chip Cp and the memory cell chip Cc, so that it is possible to perform inspection of the peripheral circuit chip Cp and the memory cell chip Cc on the wafer Wp and the wafer Wc at the same time.

By the way, there is a pad which can perform bidirectional communication between the internal pad CpP and the internal pad CcP. There is therefore a case where a direction of transmission and reception of a signal is controlled between in a case where a signal is transmitted from the probe device P1 to the probe device P2 and in a case where a signal is transmitted from the probe device P2 to the probe device P1. For this reason, in the present embodiment, control pads for transmitting and receiving control signals for controlling directions of transmission and reception of signals may be respectively provided at the peripheral circuit chip Cp and the memory cell chip Cc as part of the internal pads CpP and CcP.

Figure 7:
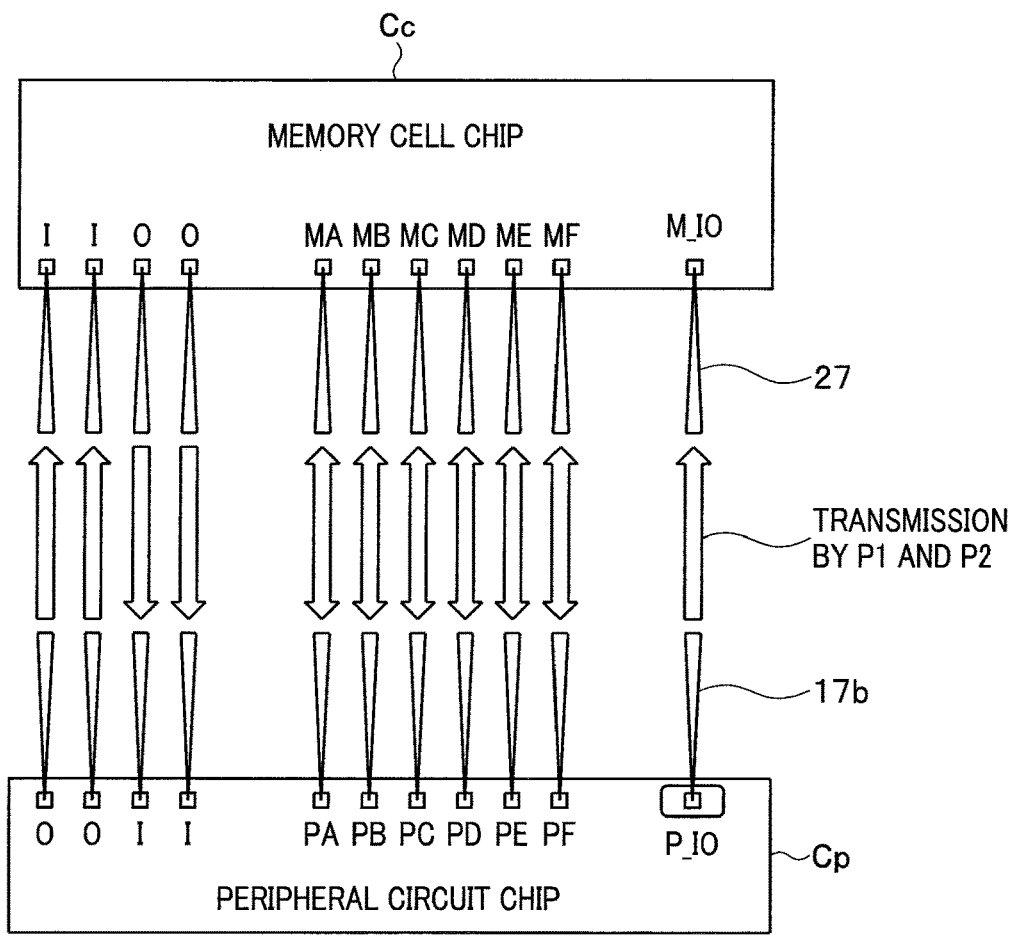
FIG. 7 is an explanatory diagram illustrating transmission and reception of signals between the peripheral circuit chip Cp and the memory cell chip Cc.
Figure 8:
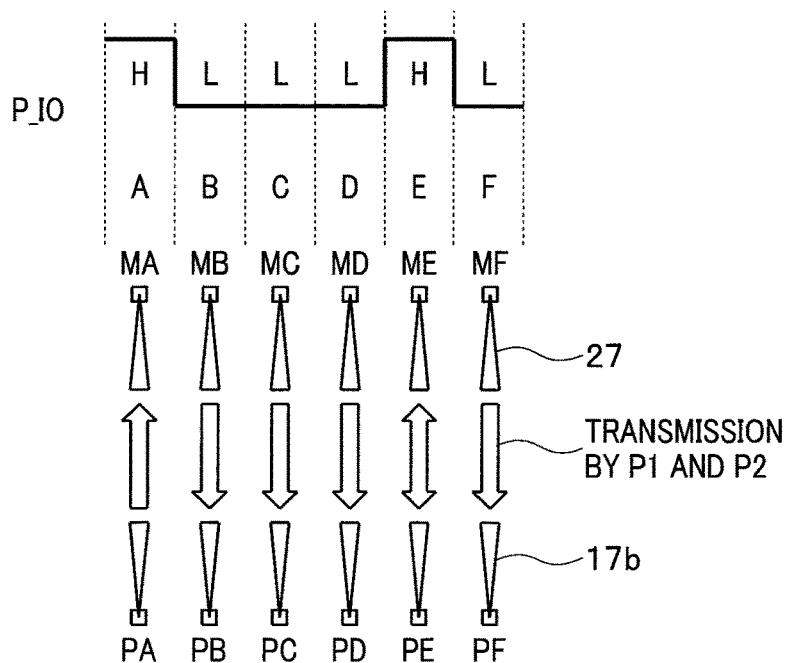
FIG. 8 is an explanatory diagram for explaining control by a control signal.

FIG. 7 is an explanatory diagram illustrating transmission and reception of signals between the peripheral circuit chip Cp and the memory cell chip Cc, and FIG. 8 is an explanatory diagram for explaining control by the control signal.

FIG. 7 illustrates an example where the peripheral circuit chip Cp employs two output pads O, two input pads I, pads PA to PF for bidirectional communication, and a control pad P_IO for control signal transmission as the internal pads CpP, and the memory cell chip Cc employs two input pads I, two output pads O, pads MA to MF for bidirectional communication, and a control pad M_IO for control signal transmission as the internal pads CcP.

FIG. 8 illustrates an example where a binary digital signal is employed as the control signal, and directions of transmission and reception of signals are controlled in accordance with levels from a period A to a period F. For example, the CPU 42 of the peripheral circuit chip Cp may generate the control signal illustrated in FIG. 8 which controls directions of transmission and reception of signals between the peripheral circuit chip Cp and the memory cell chip Cc in accordance with the test signal. The CPU 42 controls transmission and reception of signals of the internal pad CcP based on the generated control signal and outputs the generated control signal to the control pad P_IO. The control signal is supplied from the control pad P_IO to the control pad M_IO of the memory cell chip Cc via the probe 17b, the probe device P1, the transmission path TL, the probe device P2, and the probe 27. The CPU (which is not illustrated) of the memory cell chip Cc controls transmission and reception of signals of the internal pad CcP based on the received control signal.

In the example in FIG. 8, a control signal which becomes a high level (hereinafter, referred to as an H level) in the period A and the period E, and which becomes a low level (hereinafter, referred to as an L level) from the period B to the period D and in the period F is supplied to the control pad P_IO. The period A to the period F respectively correspond to the pads PA and MA, the pads PB and MB, the pads PC and MC, the pads PD and MD, the pads PE and ME, and the pads PF and MF, the H level indicates communication from the peripheral circuit chip Cp to the memory cell chip Cc, and the L level indicates communication from the memory cell chip Cc to the peripheral circuit chip Cp. In other words, as indicated with arrows, transmission from the pads PA and PE respectively to the pads MA and ME and transmission from the pads MB, MC, MD and MF respectively to the pads PB, PC, PD and PF are performed.

In this manner, in the example in FIG. 8, it is possible to control directions of transmission and reception of the signals between a plurality of internal pads CpP and CcP with one control pad by serially transmitting the control signal. Further, control by the control signal is used only during a wafer test, and after the chips are pasted to each other, signals are transmitted through direct connection between the internal pad CpP and the internal pad CcP as usual. Further, while a case has been described where the CPU 42 of the peripheral circuit chip Cp generates the control signal, the probe device P1 may generate the control signal at the control circuit 11 and may supply the control signal from the probe 17a to the peripheral circuit chip Cp via the external pad 41.

Figure 9:
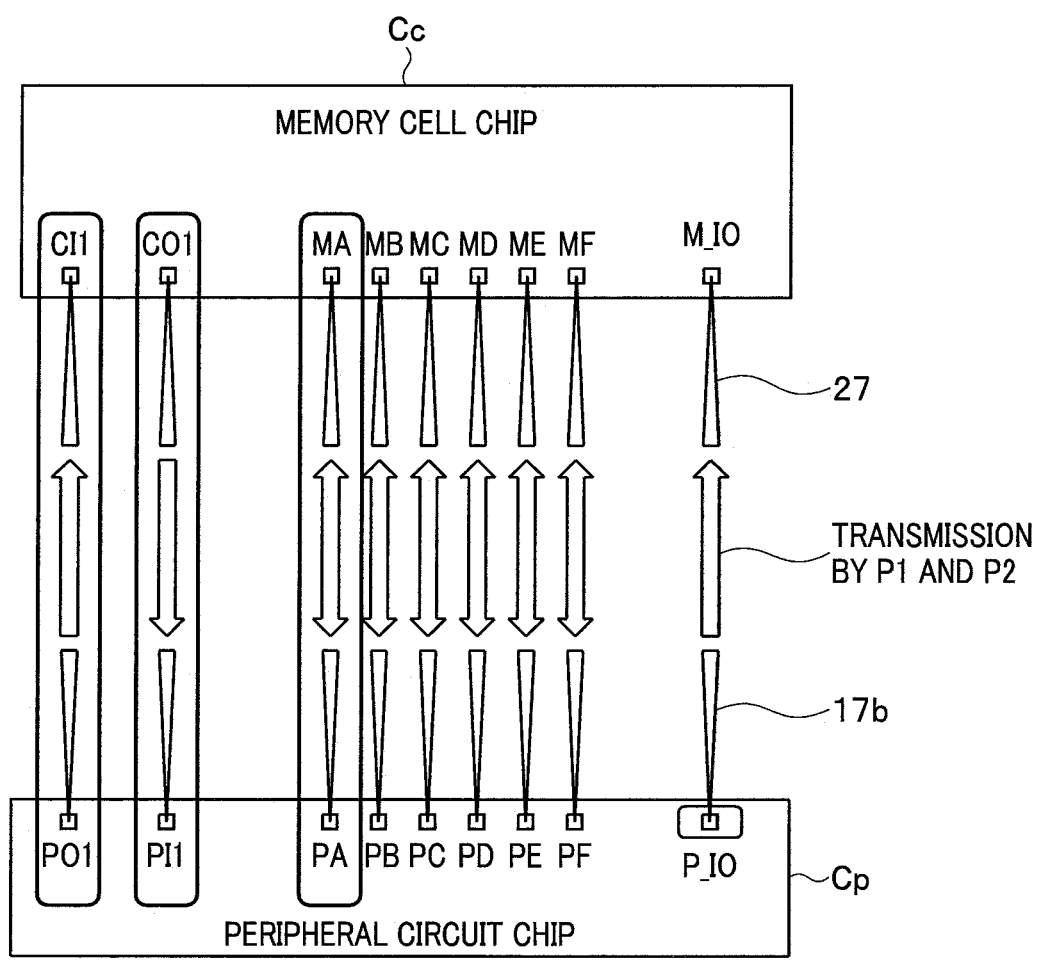
FIG. 9 is an explanatory diagram for explaining operation in a first embodiment.
Figure 10:
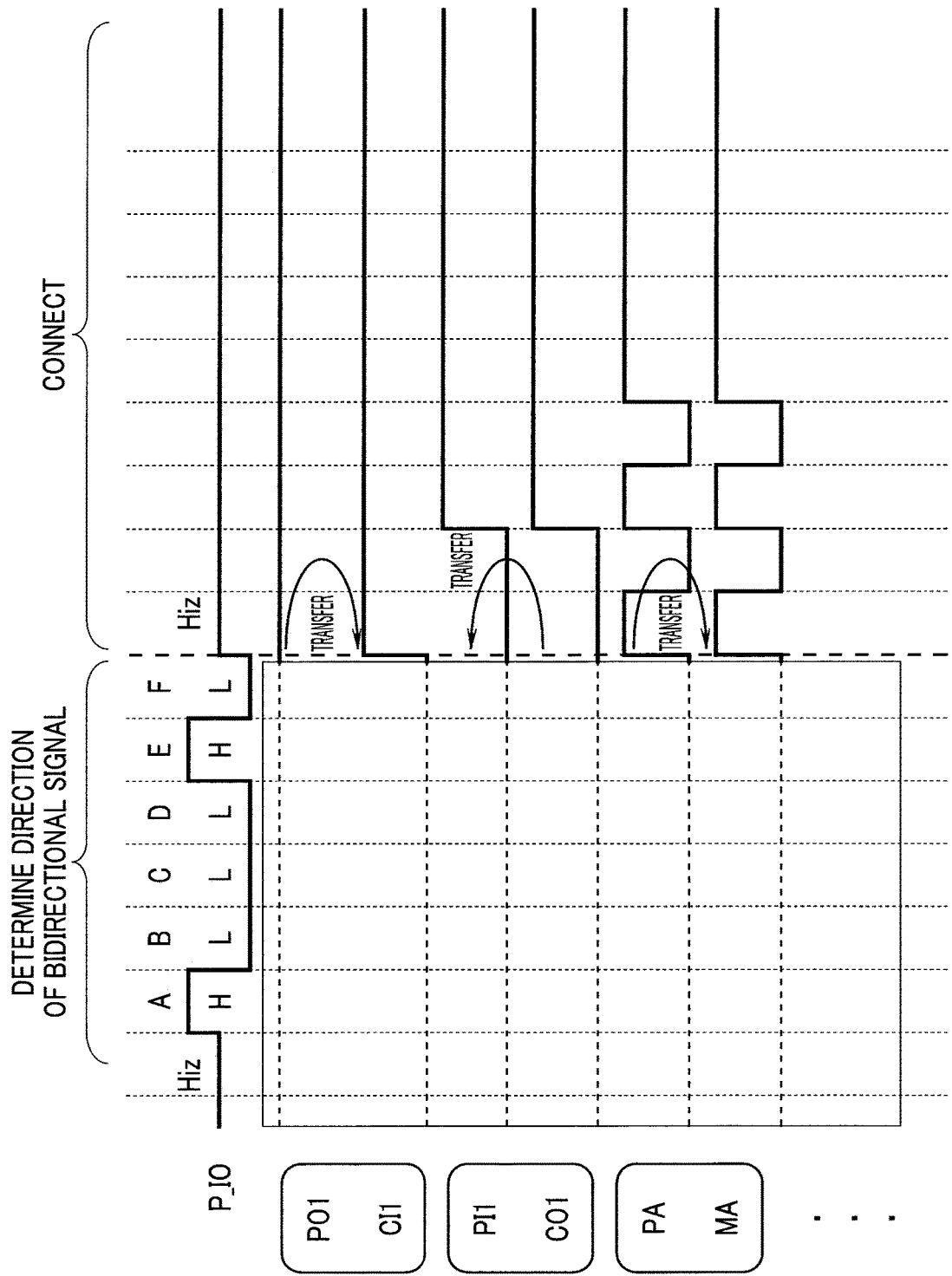
FIG. 10 is a timing chart for explaining operation in the first embodiment.

The explanatory diagram in FIG. 9 and the timing chart in FIG. 10 explain operation of digital transmission from the peripheral circuit chip Cp to the memory cell chip Cc. Note that FIG. 10 illustrates transmission timings at a portion surrounded with frames among the internal pads and the transmission paths in FIG. 9.

FIG. 9 illustrates an example where the peripheral circuit chip Cp employs one output pad PO1, one input pad PI1, pads PA to PF for bidirectional communication, and a control pad P_IO for control signal transmission as the internal pads CpP, and the memory cell chip Cc employs one input pad CI1, one output pad CO1, pads MA to MF for bidirectional communication, and a control pad M_IO for control signal transmission as the internal pads CcP. Note that power supply voltages are supplied to part of the external pads 41 of the peripheral circuit chip Cp and the internal pads CcP of the memory cell chip Cc respectively via the probe devices P1 and P2.

The CPU 42 generates a control signal and determines directions of signals in bidirectional communication. The CPU 42 transmits the control signal from the internal pad CcP to the control pad M_IO of the memory cell chip Cc via the probe 17b, the probe device P1, the probe device P2 and the probe 27 from the period A to the period F in FIG. 10. By this means, directions of transmission and reception of signals at the internal pad CpP and the internal pad CcP are determined. Note that states of the internal pads CpP and CcP from the period A to the period F are ignored.

The control signal to be supplied to the control pad P_IO becomes an H level or an L level only during a test. While a test is not performed and after the peripheral circuit chip Cp and the memory cell chip Cc are pasted to each other, as illustrated in FIG. 10, the control pad P_IO to which the control signal is to be supplied is always Hiz, and a function of controlling directions is not used while a test is not performed and after a product is completed.

When transmission of the control signal is finished, output illustrated in FIG. 10 appears at the output pad PO1 and the pad PA of the peripheral circuit chip Cp and the output pad CO1 of the memory cell chip Cc by the test signal transferred from the probe device P1 to the external pad 41 via the probe 17a. Output of the output pad PO1 and the pad PA of the peripheral circuit chip Cp is respectively transferred to the input pad CI1 and the pad MA of the memory cell chip Cc in accordance with the control signal. Further, output of the output pad CO1 of the memory cell chip Cc is transferred to the input pad PI1 of the peripheral circuit chip Cp in accordance with the control signal. Signals are transmitted between the peripheral circuit chip Cp and the memory cell chip Cc in accordance with the test signal in this manner.

FIG. 10 illustrates an example where digital transmission is performed between the probe device P1 and the probe device P2, and, for example, the memory cell chip Cc can generate a desired voltage based on the input digital value.

Figure 11:
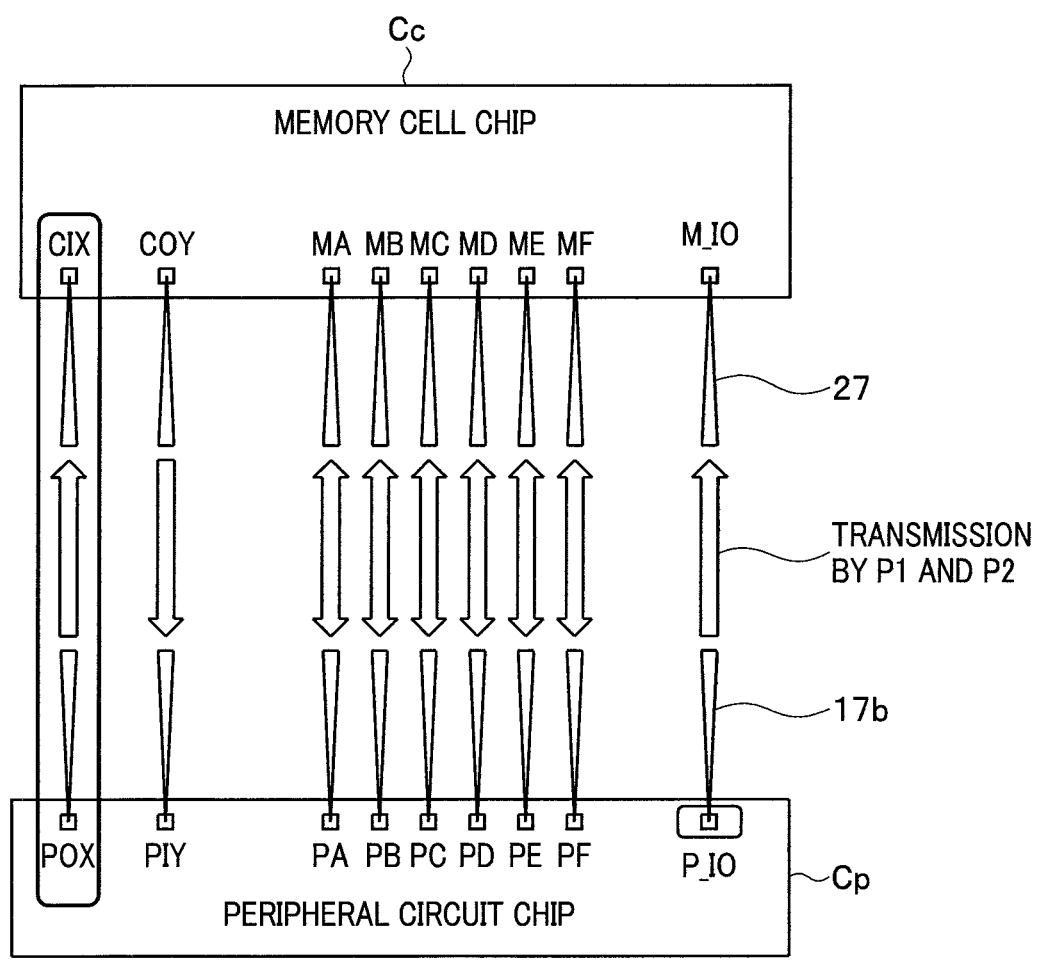
FIG. 11 is an explanatory diagram for explaining operation in the first embodiment.
Figure 12:
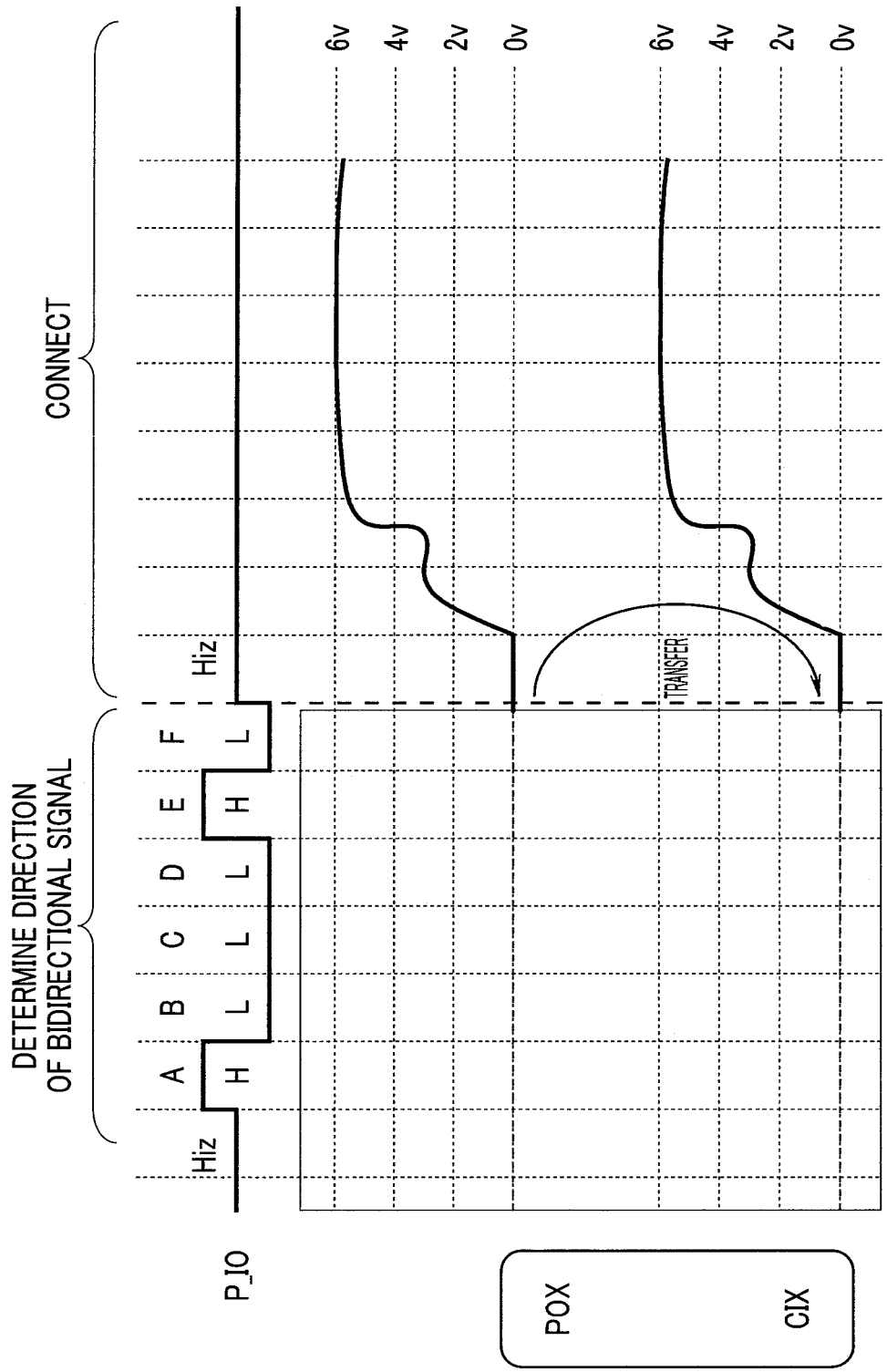
FIG. 12 is a timing chart for explaining operation in the first embodiment.

The explanatory diagram in FIG. 11 and the timing chart in FIG. 12 explain operation of analog transmission from the peripheral circuit chip Cp to the memory cell chip Cc. Note that FIG. 12 illustrates transmission timings in a portion surrounded with frames among the internal pads and the transmission paths in FIG. 11.

FIG. 11 illustrates an example where the peripheral circuit chip Cp employs one output pad PDX, one input pad PIY, pads PA to PF for bidirectional communication, and a control pad P_IO for control signal transmission as the internal pads CpP, and the memory cell chip Cc employs one input pad CIX, one output pad COY, pads MA to MF for bidirectional communication, and a control pad M_IO for control signal transmission as the internal pads CcP. Note that power supply voltages are supplied to part of the external pads 41 of the peripheral circuit chip Cp and the internal pads CcP of the memory cell chip Cc respectively via the probe devices P1 and P2.

The CPU 42 generates a control signal and determines directions of signals in bidirectional communication. The CPU 42 transmits the control signal from the internal pad CcP to the control pad M_IO of the memory cell chip Cc via the probe 17b, the probe device P1, the probe device P2 and the probe 27 from the period A to the period F in FIG. 12. By this means, directions of transmission and reception of signals at the internal pad CpP and the internal pad CcP are determined. Note that states of the internal pads CpP and CcP in this period are ignored. When transmission of the control signal is finished, output illustrated in FIG. 12 appears at the output pad PDX of the peripheral circuit chip Cp by the test signal transferred from the probe device P1 to the external pad 41 via the probe 17a. The output is transferred to the input pad CIX of the memory cell chip Cc in accordance with the control signal. In this manner, a voltage which changes, for example, from 0 V to 6 V is supplied from the peripheral circuit chip Cp to the memory cell chip Cc.

By the way, in the examples in FIG. 9 and FIG. 10, the memory cell chip Cc generates a voltage based on a signal transmitted by a pulse generator, or the like. However, there is also a possibility that the pulse generator, or the like, cannot finely adjust a voltage. It is therefore also possible to consider disposing a pump circuit at the memory cell chip Cc.

Figure 13:
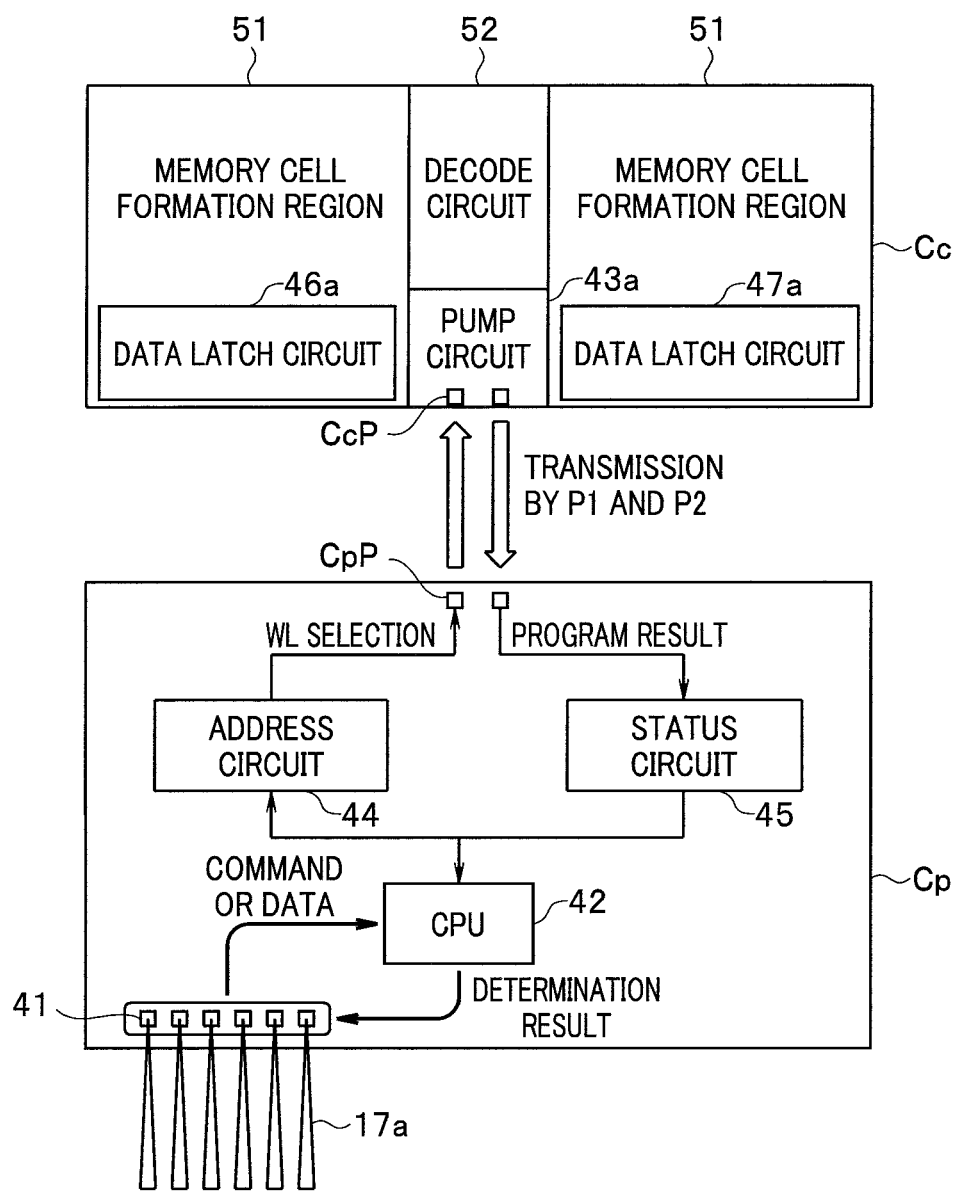
FIG. 13 is a block diagram illustrating a circuit portion which involves a wafer test inside the peripheral circuit chip Cp and the memory cell chip Cc.

FIG. 13 is a block diagram illustrating a circuit portion which involves a wafer test inside the peripheral circuit chip Cp and the memory cell chip Cc in this case. In FIG. 13, the same reference numerals will be assigned to components which are the same as the components in FIG. 5, and description will be omitted.

In the example in FIG. 13, the pump circuit 43 and the data latch circuits 46 and 47 which are provided at the peripheral circuit chip Cp in FIG. 5, are provided at the memory cell chip Cc, and a pump circuit 43a and data latch circuits 46a and 47a inside the memory cell chip Cc respectively have functions similar to the pump circuit 43 and the data latch circuits 46 and 47.

In other words, in the example in FIG. 5, the pump circuit 43 generates a voltage in accordance with the test signal under control by the CPU 42, the CPU 42 supplies a signal in accordance with the generated voltage to the memory cell chip Cc via the internal pad CpP, and the memory cell chip Cc generates a voltage from the received signal.

In contrast, in the example in FIG. 13, the CPU 42 supplies a signal in accordance with a voltage based on the test signal to the memory cell chip Cc via the internal pad CpP. The pump circuit 43a of the memory cell chip Cc generates a voltage from the received signal.

Further, in the example in FIG. 5, the CPU 42 provides data in accordance with the test signal to the data latch circuits 46 and 47, and the data latch circuits 46 and 47 supply the data to the memory cell chip Cc via the internal pad CpP.

In contrast, in the example in FIG. 13, the CPU 42 generates a signal based on the test signal and supplies the signal to the memory cell chip Cc via the internal pad CpP. The memory cell chip Cc generates a voltage in accordance with the received signal and causes the data latch circuits 46a and 47a to latch the voltage.

As in the example in FIG. 5, in a case where a drive voltage to be used at the memory cell chip Cc is controlled at the peripheral circuit chip Cp or the test device 2, the number of probes increases and the configuration of the test device 2 becomes complicated. In contrast, as in FIG. 13, in a case where the pump circuit and the data latch circuit are moved to inside of the memory cell chip Cc, it may be possible not to control a drive voltage to be used at the memory cell chip Cc, at the peripheral circuit chip Cp or the test device 2, which can reduce the number of probes.

Further, there is variation in voltages generated from the peripheral circuit chip Cp, and in a case where a test is performed after a voltage from the peripheral circuit chip Cp is provided to the memory cell chip Cc, there is a case where the number of tests may increase. In the example in FIG. 13, it is possible to generate a stable voltage at the memory cell chip Cc, which results in advantages that it is possible to reduce the number of tests and prevent increase in manufacturing cost.

In this manner, in the present embodiment, it is possible to electrically connect the peripheral circuit chip Cp and the memory cell chip Cc by respectively connecting two probe devices P1 and P2 to the internal pad CpP of the peripheral circuit chip Cp and the internal pad CcP of the memory cell chip Cc and allowing the probe devices P1 and P2 to perform communication with each other. This enables tests to be performed at the same time on the peripheral circuit chip Cp and the memory cell chip Cc on the wafers before the chips are pasted to each other, so that it is possible to shorten a wafer test period and improve a yield ratio.

Modified Example 1

Figure 14:
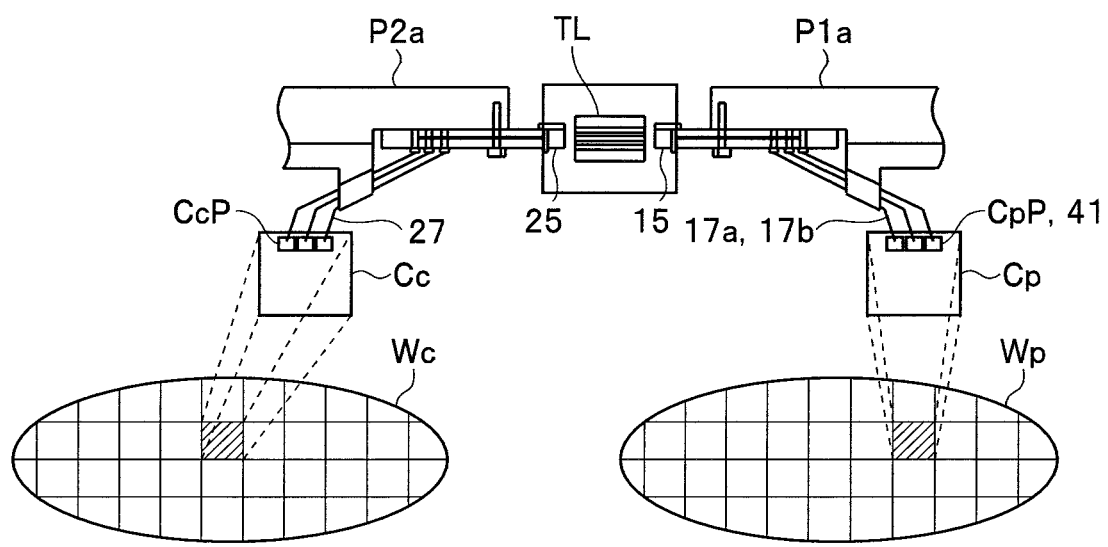
FIG. 14 is an explanatory diagram illustrating a modified example.

FIG. 14 is an explanatory diagram illustrating a modified example. In FIG. 14, the same reference numerals will be assigned to components which are the same as the components in FIG. 6, and description will be omitted.

FIG. 6 illustrates an example where a test is performed in a state where the probe device P1 and the probe device P2 are connected to the peripheral circuit chip Cp and the memory cell chip Cc at the same position on the wafer Wp and the wafer Wc. According to the configuration in FIG. 1, it is possible to dispose the probes 17 and 27 of the probe device P1 and the probe device P2 at any positions on the wafers Wp and Wc before the chips are pasted to each other.

Thus, in the present modified example, as illustrated in FIG. 14, the probes 17 and 27 are connected to the peripheral circuit chip Cp and the memory cell chip Cc formed at different positions (shaded areas) on the wafers Wp and Wc. In this manner, in the present modified example, a test is performed in a state where the probe device P1 and the probe device P2 are respectively connected to the peripheral circuit chip Cp at any position on the wafer Wp and the memory cell chip Cc at any position on the wafer Wc.

Other configurations and operation are similar to those in the first embodiment.

Modified Example 2

Figure 15:
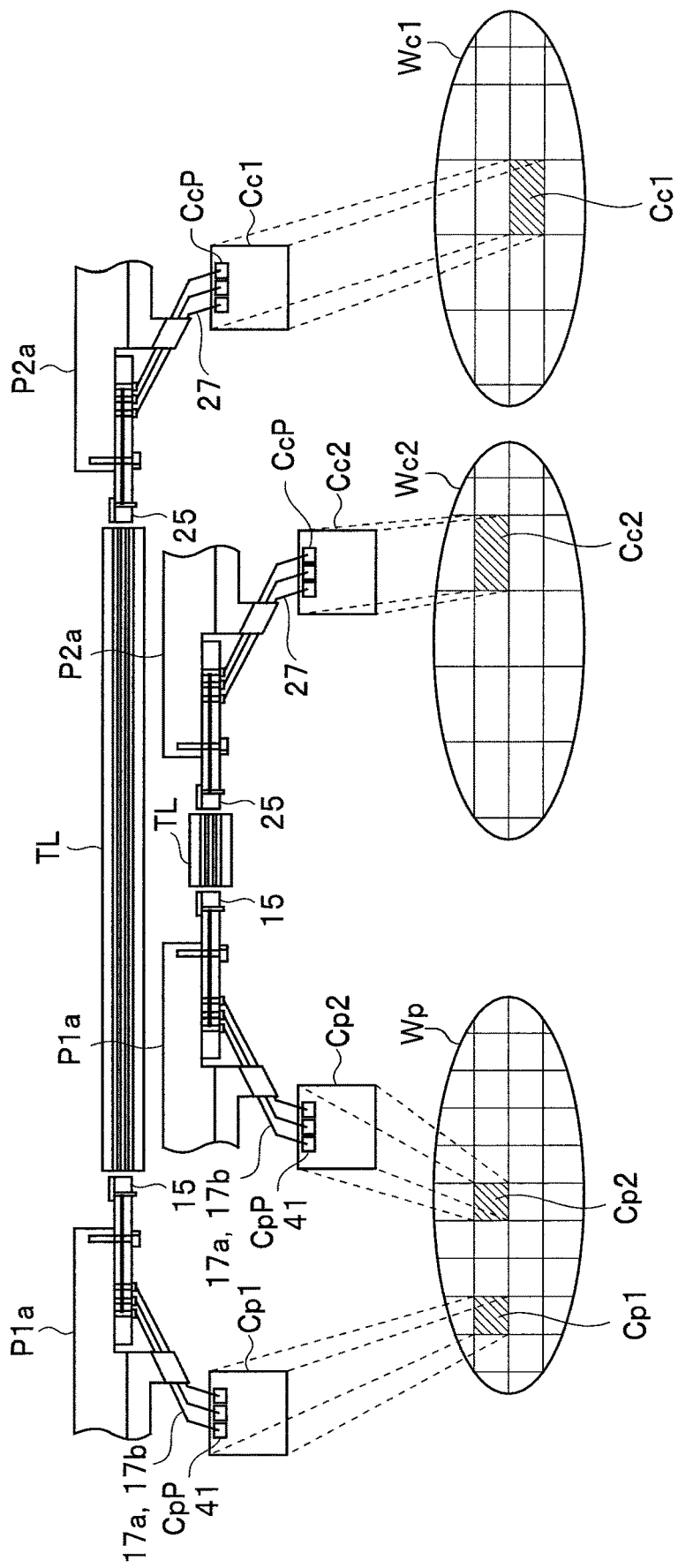
FIG. 15 is an explanatory diagram illustrating a modified example.

FIG. 15 is an explanatory diagram illustrating a modified example. In FIG. 15, the same reference numerals will be assigned to components which are the same as the components in FIG. 6, and description will be omitted.

The wafers Wp and Wc illustrated in FIG. 6 are prepared while taking into account that a semiconductor storage device in which the peripheral circuit chip Cp and the memory cell chip Cc are connected is manufactured by the wafers being pasted to each other, and sizes and arrangement of the peripheral circuit chip Cp and the memory cell chip Cc are the same between the wafers Wp and Wc.

In contrast, in the example in FIG. 15, the sizes and arrangement on the wafers of the peripheral circuit chip Cp and the memory cell chip Cc are different between the wafer Wp and the wafer Wc. A plurality of peripheral circuit chips Cp are formed on the wafer Wp. Further, a plurality of memory cell chips Cc are formed on the wafers Wc1 and Wc2. The sizes and arrangement on the wafers of the peripheral circuit chip Cp and the memory cell chip Cc which are to be formed are different between the wafer Wp, and the wafers Wc1 and Wc2.

FIG. 15 illustrates an example in a case where the probe device P1 is connected to the peripheral circuit chip Cp1 on the wafer Wp and the probe device P2 is connected to the memory cell chip Cc1 on the wafer Wc1, and in a case where the probe device P1 is connected to the peripheral circuit chip Cp2 on the wafer Wp and the probe device P2 is connected to the memory cell chip Cc2 on the wafer Wc2. It is possible to perform inspection in various kinds of combinations by relatively moving the probe device P1 and the wafer Wp and relatively moving the probe device P2 and the wafers Wc1 and Wc2.

By the way, as described above, in a case where tests cannot be performed on the peripheral circuit chip Cp and the memory cell chip Cc at the same time, it is also possible to consider performing a test on a semiconductor storage device which is completed by pasting the peripheral circuit chip Cp and the memory cell chip Cc so as to shorten the test period. In other words, in this case, it is impossible to find a chip defect before the semiconductor storage device is completed, and thus, a manufacturing method of manufacturing a semiconductor storage device which is completed by pasting the wafers to each other is employed in view of efficiency of manufacturing. However, in this case, it is necessary to make chip sizes and pad sizes within the wafers the same and paste the chips on the same coordinate within the wafers to each other. Thus, even in a case where it is essentially possible to constitute relatively many peripheral circuit chips Cp having a small circuit area on one wafer, it is only possible to form the peripheral circuit chips Cp of the same number as the number of the memory cell chips Cc on one wafer.

In contrast, in modified example 1 and modified example 2, it is possible to perform tests on chips at the same time by combining the peripheral circuit chip Cp and the memory cell chip Cc at any positions on any wafers. This makes it possible to find, for example, a combination of a non-defective peripheral circuit chip Cp and a non-defective memory cell chip Cc in states of wafers. Thus, even if a manufacturing method of combining a non-defective peripheral circuit chip Cp and a non-defective memory cell chip Cc and pasting the chips to each other instead of pasting the wafers to each other is employed, it is not inefficient. In other words, in the test in modified example 1 and modified example 2, it is possible to prevent pasting of a non-defective chip to a defective chip, so that it is possible to improve a yield ratio.

In this manner, in modified example 1 and modified example 2, even in a case where circuit areas in wafers are different between the peripheral circuit chip Cp and the memory cell chip Cc, it is possible to combine chips to be inspected from these wafers, so that it is possible to select at least one chip to be combined from a plurality of wafers and perform a wafer test. It is possible to achieve a multiple chip concerning peripheral circuit chips having a small circuit area, and it is not necessary to perform tests again on different peripheral circuit chips in accordance with cell capacity of the memory cell chip Cc, so that it is possible to reduce a development period and cost.

Second Embodiment

Figure 16:
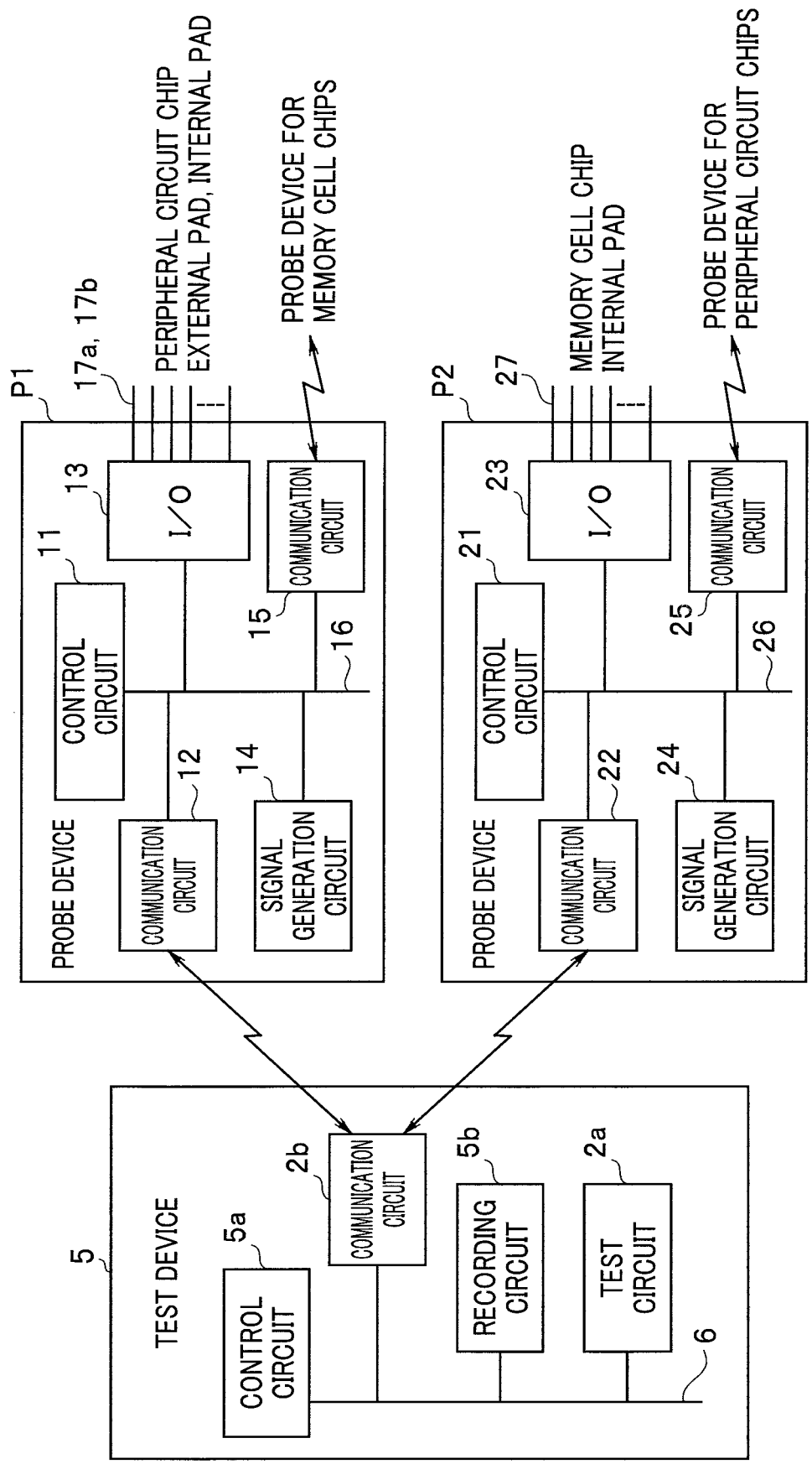
FIG. 16 is a block diagram illustrating a second embodiment.

FIG. 16 is a block diagram illustrating a second embodiment. In FIG. 16, the same reference numerals will be assigned to components which are the same as components in FIG. 1, and description will be omitted.

The present embodiment improves a yield ratio by combining a non-defective chip on the wafer Wp and a non-defective chip on the wafer Wc. Also in the present embodiment, it is possible to perform wafer tests at the same time on the peripheral circuit chip Cp at any position on the wafer Wp and the memory cell chip Cc at any position on the wafer Wc. Thus, by performing tests while changing a combination of the chips on the wafers Wp and Wc, it is possible to select chips appropriate for the combination, which results in improving a yield ratio.

FIG. 16 is different from the first embodiment in that a test device 5 is employed in place of the test device 2. The test device 5 includes a control circuit 5a which controls the whole of the test device 5. The control circuit 5a may be constituted with a processor using a CPU, an FPGA, or the like, may control respective units by operating in accordance with programs stored in a memory which is not illustrated or implement part or all of the functions with a hardware electronic circuit.

The control circuit 5a is connected to respective units inside the test device 5 via a bus 6. The control circuit 5a controls the test circuit 2a to perform tests on the peripheral circuit chip Cp and the memory cell chip Cc. Further, the control circuit 5a performs tests while changing a combination of the peripheral circuit chip Cp and the memory cell chip Cc. In the present embodiment, the control circuit 5a records a test result by the test circuit 2a in a recording circuit 5b and makes an assessment such as determination as to whether or not the chip is defective and determination as to compatibility for the peripheral circuit chip Cp and the memory cell chip Cc which are test targets based on the test result and records an assessment result in the recording circuit 5b.

Note that while an example has been described in FIG. 16 where the recording circuit 5b is provided inside the test device 5, the assessment result may be recorded in an external server, or the like, which is not illustrated. Further, while an example has been described where the control circuit 5a inside the test device 5 makes an assessment such as determination as to whether or not the chip is defective and determination as to compatibility, external equipment which is not illustrated may make an assessment and record an assessment result.

Figure 17:
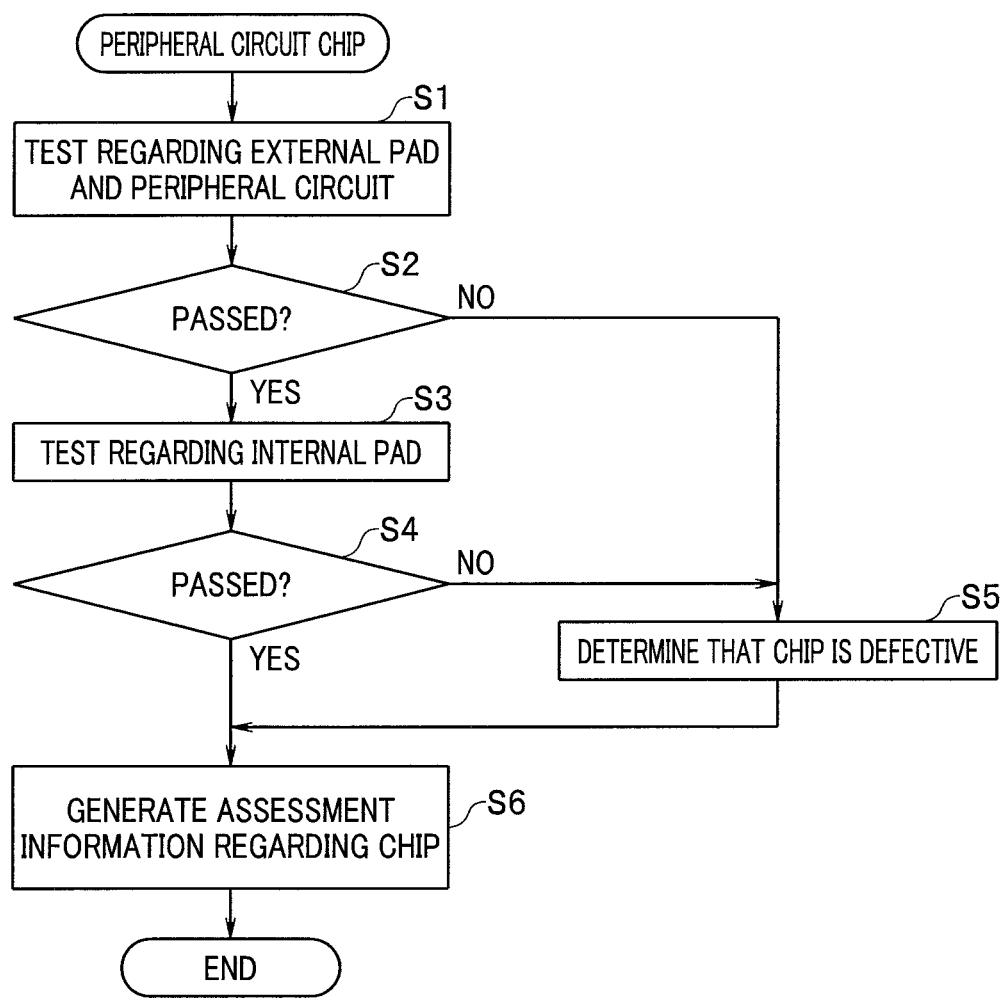
FIG. 17 is a flowchart for explaining operation in the second embodiment.
Figure 18:
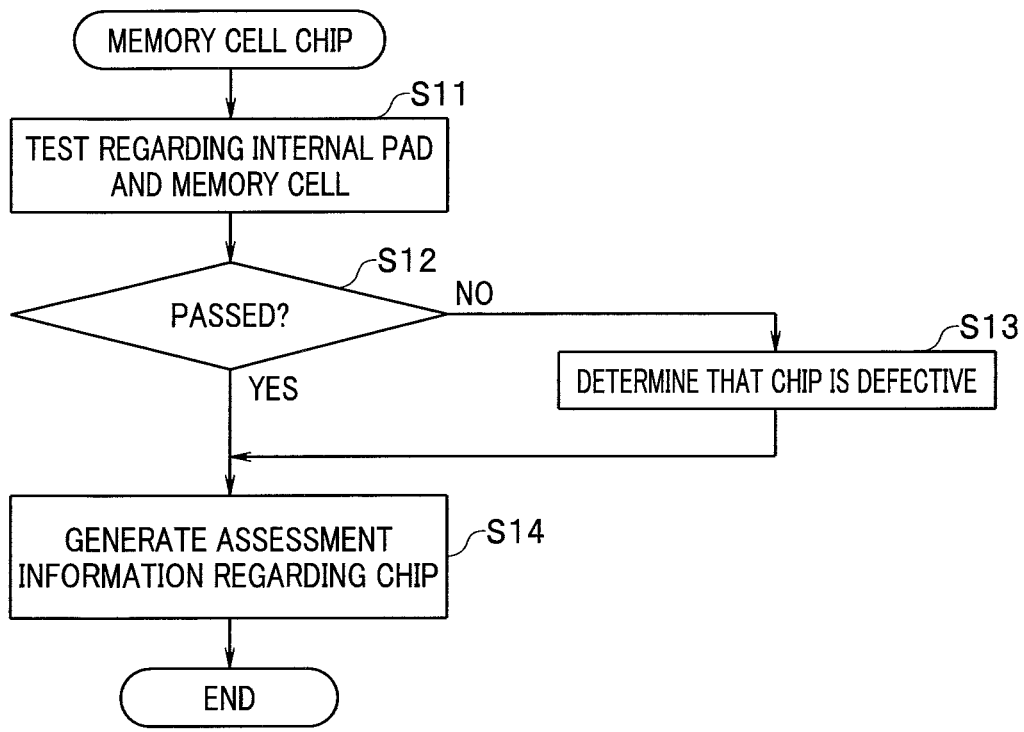
FIG. 18 is a flowchart for explaining operation in the second embodiment.

Operation in the embodiment configured in this manner will be described next with reference to the flowcharts in FIG. 17 and FIG. 18.

The test device 5 controls the test circuit 2a to perform tests on the peripheral circuit chip Cp and the memory cell chip Cc. The probes 17a and 17b of the probe device P1 are respectively connected to the external pad 41 and the internal pad CpP of the peripheral circuit chip Cp at a predetermined position on the wafer Wp. Further, the probe 27 of the probe device P2 is connected to the internal pad CcP of the memory cell chip Cc at a predetermined position on the wafer Wc.

The test circuit 2a transmits a test signal to the probe device P1. The test circuit 2a performs a contact test on the external pad 41 in step S1 in FIG. 17. The probe device P1 provides the test signal to the external pad 41 of the peripheral circuit chip Cp via the probe 17a. A signal from the probe 17a is received at the I/O 13 of the probe device P1 and transferred to the test circuit 2a of the test device 5 by the communication circuits 12 and 2b. The test circuit 2a performs a contact test for confirming an electrical connection state such as continuity of the external pad 41 using the received signal.

The test circuit 2a determines whether or not the external pad 41 has passed or failed the contact test in step S2. In a case where the external pad 41 has failed the contact test, the test circuit 2a determines that the peripheral circuit chip Cp which is an inspection target is defective (step S5), generates assessment information indicating that the peripheral circuit chip Cp is defective and records the assessment information in the recording circuit 5b (step S6). In a case where the external pad 41 has passed the contact test, the test circuit 2a performs a test regarding the peripheral circuit.

The test signal is supplied from the probe device P1 to the peripheral circuit chip Cp via the probe 17a. For example, an operation test (function test) is performed by a pattern for confirming logical design being supplied as the test signal. Characteristic information such as various kinds of thresholds and an output value of the pump circuit can be obtained through the function test. A result of the function test is supplied from the probe 17a to the I/O 13 of the probe device P1 and transferred to the test circuit 2a of the test device 5 by the communication circuits 12 and 2b. The test circuit 2a obtains the test result of the function test of the peripheral circuit chip Cp by the received signal.

The test circuit 2a determines whether the peripheral circuit chip Cp has passed or failed the function test in step S2. In a case where the peripheral circuit chip Cp has failed the function test, the test circuit 2a determines that the peripheral circuit chip Cp which is an inspection target is defective (step S5), generates assessment information indicating that the peripheral circuit chip Cp is defective and records the assessment information in the recording circuit 5b (step S6). In a case where the peripheral circuit chip Cp has passed the function test, the test circuit 2a performs a test (contact test) regarding the internal pad CpP in step S3.

A test signal for performing a contact test is provided from the probe device P1 to the internal pad CpP of the peripheral circuit chip Cp via the probe 17b. A result of the contact test is supplied from the probe 17b to the I/O 13 of the probe device P1 and transferred to the test circuit 2a of the test device 5 by the communication circuits 12 and 2b. The test circuit 2a obtains the test result of the contact test of the internal pad CpP by the received signal.

The test circuit 2a determines whether the internal pad CpP of the peripheral circuit chip Cp has passed or failed the contact test in step S4. In a case where the internal pad CpP has failed the contact test, the test circuit 2a determines that the peripheral circuit chip Cp which is an inspection target is defective (step S5), generates assessment information indicating that the peripheral circuit chip Cp is defective and records the assessment information in the recording circuit 5b (step S6). In a case where the test circuit 2a determines that the internal pad CpP has passed the contact test, the test circuit 2a generates assessment information indicating that the peripheral circuit chip Cp is non-defective and records the assessment information in the recording circuit 5b (step S6).

Note that the test circuit 2a may generate assessment information based on results of the contact test and the function test as well as information indicating whether or not the peripheral circuit chip Cp is defective and may record the assessment information in the recording circuit 5b.

Further, the test circuit 2a transmits the test signal also to the probe device P2. The test circuit 2a performs a contact test on the internal pad CcP in step S11 in FIG. 18. The probe device P2 provides the test signal to the internal pad CcP of the memory cell chip Cc via the probe 27. Further, the signal from the probe 27 is received at the I/O 23 of the probe device P2 and transferred to the test circuit 2a of the test device 5 by the communication circuits 22 and 2b. The test circuit 2a can confirm an electrical connection state such as continuity of the internal pad CcP with the received signal.

The test circuit 2a determines whether the internal pad CcP has passed or failed the contact test in step S12. In a case where the internal pad CcP has failed the contact test, the test circuit 2a determines that the memory cell chip Cc which is an inspection target is defective (step S13), generates assessment information indicating that the memory cell chip Cc is defective, and records the assessment information in the recording circuit 5b (step S14).

Further, the test circuit 2a generates a test signal for performing a characteristic test on the memory cell chip Cc (step S11). The test signal is supplied from the probe device P1 to the peripheral circuit chip Cp via the probe 17a. The peripheral circuit chip Cp supplies the signal for performing the characteristic test from the internal pad CpP to the internal pad CcP via the probe 17b, the probe devices P1 and P2 and the probe 27. By this means, the characteristic test is performed, and a result of the characteristic test is supplied to the I/O 13 of the probe device P1 via the internal pad CcP, the probe 27, the probe device P2, the probe device P1, the internal pad CpP, the external pad 41 and the probe 17a and transferred to the test circuit 2a of the test device 5 by the communication circuits 12 and 2b. The test circuit 2a obtains a test result of the characteristic test of the memory cell chip Cc by the received signal.

The test circuit 2a determines whether the memory cell chip Cc has passed or failed the characteristic test in step S12. In a case where the memory cell chip Cc has failed the characteristic test, the test circuit 2a determines that the memory cell chip Cc which is an inspection target is defective (step S13), generates assessment information indicating that the memory cell chip Cc is defective, and records the assessment information in the recording circuit 5b (step S14). In a case where the memory cell chip Cc has passed the characteristic test, the test circuit 2a generates assessment information indicating that the memory cell chip Cc is non-defective and records the assessment information in the recording circuit 5b (step S14).

Note that the test circuit 2a may generate assessment information based on results of the contact test and the characteristic test as well as information indicating whether or not the memory cell chip Cc is defective and may record the assessment information in the recording circuit 5b.

The control circuit 5a switches the peripheral circuit chip Cp and the memory cell chip Cc to be inspected while changing a relative positions between the probe device P1 and the wafer Wp and a relative position between the probe device P2 and the wafer Wc. By this means, assessment information regarding respective chips on the wafers is accumulated in the recording circuit 5b. The assessment information indicates determination results as to whether or not respective chips are defective and becomes information for determining compatibility between a predetermined peripheral circuit chip Cp and a predetermined memory cell chip Cc. The control circuit 5a determines a combination of compatible chips by utilizing the assessment information. The control circuit 5a performs a wafer test on the determined combination. In this manner, it becomes possible to manufacture a semiconductor storage device by combining compatible chips, so that it is possible to improve a yield ratio.

FIG. 19 is an explanatory diagram for explaining an aspect where tests are performed at the same time on a plurality of sets of the peripheral circuit chips Cp and the memory cell chips Cc.

A test system in FIG. 19 includes the test device 5 which has the same configuration as the configuration in FIG. 16, units of nine probe devices P1 and units of nine probe devices P2 which have the same configurations as the configurations in FIG. 16. The wafer Wp for peripheral circuits is mounted on a stage 32p, and the wafer Wc for memory cells is mounted on a stage 32c.

Probes 17a and 17b of the units of nine probe devices P1 are connected to external pads 41 and internal pads CpP of nine peripheral circuit chips Cp on the wafer Wp. Further, probes 27 of the units of nine probe devices P2 are connected to internal pads CcP of nine memory cell chips Cc on the wafer Wc.

Further, in the example in FIG. 19, the communication circuit 2b of the test device 5 is constituted with contact portions 35p and 35c and a switching portion 36, and the units of the respective probe devices P1 are respectively connected to the contact portions 35p constituting the communication circuit 2b of the test device 5. Further, the units of the respective probe devices P2 are respectively connected to the contact portions 35c constituting the communication circuit 2b of the test device 5. The contact portions 35p and 35c are constituted with, for example, connectors, or the like, in a case where the communication circuits 12 and 22 of the units of the respective probe devices P1 and P2 perform communication with the communication circuit 2b of the test device 5 in a wired manner, and are constituted with, for example, an antenna, a light emitting element, or the like, in a case where the communication circuits 12 and 22 perform communication with the communication circuit 2b in a wireless manner.

The test device 5 supplies test signals to the units of nine probe devices P1, and the units of the respective probe devices P1 supply the test signals to nine peripheral circuit chips Cp on the wafer Wp via the respective probes 17a. Further, the respective internal pads CpP of nine peripheral circuit chips Cp are connected to the respective internal pads CcP of nine memory cell chips Cc via probes 17b and the internal circuits of the units of nine probe devices P1, the internal circuits and the probes 27 of the units of nine probe devices P2. In this manner, nine peripheral circuit chips Cp on the wafer Wp are respectively, individually and electrically connected to nine memory cell chips Cc on the wafer Wc.

An assessment such as whether or not the chip is defective and compatibility is made first in this state. The test device 5 makes an assessment such as whether or not the chip is defective and compatibility on the respective peripheral circuit chips Cp and the respective memory cell chips Cc. The control circuit 5a of the test device 5 determines a combination of the peripheral circuit chip Cp and the memory cell chip Cc in accordance with whether or not the chip is defective and compatibility and performs a wafer test. The switching portions 36 which constitute the communication circuit 2b of the test device 5 can appropriately set a combination of the peripheral circuit chip Cp and the memory cell chip Cc which are to be connected.

In the example in FIG. 19, arrows inside the test device 5 indicate that tests are performed on respective combinations of the respective peripheral circuit chips Cp and the respective memory cell chips Cc connected to units of the respective probe devices P1 which are to be connected to the first, the second, the third, the fourth, the seventh, the eighth, and the ninth contact portions 35p from the right among the units of nine probe devices P1 and units of the respective probe devices P2 which are to be connected to the second, the third, the fourth, the fifth, the sixth, the seventh and the ninth contact portions 35c from the left among the units of nine probe devices P2. Note that a set of the peripheral circuit chip Cp and the memory cell chip Cc to which the corresponding contact portion 35p and contact portion 35c are not connected among the peripheral circuit chips Cp and the memory cell chips Cc connected to the units of nine probe devices P1 and the units of nine probe devices P2, is defective chips, and test signals are not transmitted.

In this manner, in the present embodiment, by performing tests while changing a combination of chips on the wafers Wp and Wc, it becomes possible to select chips appropriate for a combination, which results in achieving improvement of a yield ratio.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A test system which electrically connects one or more first semiconductor chips formed on a first wafer and one or more second semiconductor chips formed on a second wafer to test the one or more first semiconductor chips and the one or more second semiconductor chips, the test system comprising:
   a test device configured to supply a test signal to each of the one or more first semiconductor chips;
   at least one first probe device comprising a first probe to be connected to at least one first internal pad of each of the one or more first semiconductor chips and a first communication circuit configured to transmit and receive a signal; and
   at least one second probe device comprising a second probe to be connected to at least one second internal pad of each of the one or more second semiconductor chips and a second communication circuit configured to transmit and receive the signal to and from the first communication circuit,
   wherein communication is performed between the first internal pad and the second internal pad based on a control signal which controls a direction of a signal between the first internal pad of the each of one or more first semiconductor chips and the second internal pad of the each of one or more second semiconductor chips.

2. The test system according to claim 1,
   wherein the first probe device comprises a third probe to be connected to an external pad of each of the one or more first semiconductor chips and supplies the test signal to each of the one or more first semiconductor chips via the third probe and the external pad.

3. The test system according to claim 2,
   wherein the first probe device supplies the external pad with a signal for causing a first voltage generation circuit included in each of the one or more first semiconductor chips to generate a voltage via the third probe.

4. The test system according to claim 2,
   wherein the first probe device supplies the external pad with a signal for causing a first data latch circuit included in each of the one or more first semiconductor chips to generate data via the third probe.

5. The test system according to claim 1,
   wherein when the one or more first semiconductor chips and the one or more second semiconductor chips are tested, the first probe device generates the control signal based on the test signal and supplies the control signal to each of the one or more first semiconductor chips and each of the one or more second semiconductor chips.

6. The test system according to claim 1,
   wherein when the one or more first semiconductor chips and the one or more second semiconductor chips are tested, each of the one or more first semiconductor chips generates the control signal based on the test signal, and the first probe device captures the control signal via the first probe and supplies the control signal to each of the one or more second semiconductor chips.

7. The test system according to claim 1,
   wherein the first internal pad of each of the one or more first semiconductor chips comprises a first control pad for transmitting the control signal to each of the one or more second semiconductor chips, and
   the second internal pad of each of the one or more second semiconductor chips comprises a second control pad for receiving the control signal from each of the one or more first semiconductor chips.

8. The test system according to claim 7,
wherein the at least one first internal pad comprises a plurality of first internal pads and the at least one second internal pad comprises a plurality of second internal pads, and
the first control pad and the second control pad are put into a high impedance state during a period other than a period while directions of respective signals between the plurality of first internal pads and the plurality of second internal pads are controlled based on the control signal.

9. The test system according to claim 1,
wherein the control signal is a digital signal which becomes a high level or a low level in accordance with the direction of the signal between the first internal pad and the second internal pad.

10. The test system according to claim 9,
wherein the at least one first internal pad comprises a plurality of first internal pads and the at least one second internal pad comprises a plurality of second internal pads, and
the control signal is serial data indicating directions of respective signals between the plurality of first internal pads and the plurality of second internal pads.

11. The test system according to claim 1, wherein
the first probe device comprises a first signal generation circuit configured to convert a signal captured from the first internal pad via the first probe into the signal which can be transmitted by the first communication circuit and the second communication circuit, and
the second probe device comprises a second signal generation circuit configured to return the signal received by the second communication circuit into a signal before being converted by the first signal generation circuit and provide the returned signal to the second internal pad via the second probe.

12. The test system according to claim 11, wherein
the second signal generation circuit converts a signal captured from the second internal pad via the second probe into the signal which can be transmitted by the first communication circuit and the second communication circuit, and
the first signal generation circuit returns the signal received by the first communication circuit into a signal before being converted by the second signal generation circuit and provides the returned signal to the first internal pad via the first probe.

13. The test system according to claim 1, wherein
each of the one or more first semiconductor chips generates a signal for causing a second voltage generation circuit included in each of the one or more second semiconductor chips to generate a voltage,
the first probe device comprises a first signal generation circuit configured to convert a signal captured from the first internal pad via the first probe into a digital signal which can be transmitted by the first communication circuit and the second communication circuit, and
the first communication circuit causes the second communication circuit to receive the signal for causing the second voltage generation circuit to generate a voltage.

14. The test system according to claim 1, wherein
each of the one or more first semiconductor chips generates a signal for causing a second data latch circuit included in each of the one or more second semiconductor chips to generate data,
the first probe device comprises a first signal generation circuit configured to convert a signal captured from the first internal pad via the first probe into a digital signal which can be transmitted by the first communication circuit and the second communication circuit, and
the first communication circuit causes the second communication circuit to receive the signal for causing the second data latch circuit to generate data.

15. The test system according to claim 1,
wherein the first probe device and the second probe device have a same structure.

16. The test system according to claim 1,
wherein the test device comprises:
a test circuit configured to generate the test signal and assess each of the one or more first semiconductor chips and each of the one or more second semiconductor chip; and
a control circuit configured to determine a combination of the one or more first semiconductor chips on the first wafer and the one or more second semiconductor chips on the second wafer based on an assessment result by the test circuit.

17. The test system according to claim 16, wherein
the at least one first probe device comprises a plurality of first probe devices and the at least one second probe device comprises a plurality of second probe devices, and
the test device performs tests at a same time on a plurality of combinations of the first semiconductor chips connected to the first probe devices and the second semiconductor chips connected to the second probe devices.

18. A test system which electrically connects one or more first semiconductor chips formed on a first wafer and one or more second semiconductor chips formed on a second wafer to test the one or more first semiconductor chips and the one or more second semiconductor chips, the test system comprising:
a test device configured to supply a test signal to each of the one or more first semiconductor chips;
at least one first probe device comprising a first probe to be connected to at least one first internal pad of each of the one or more first semiconductor chips and a first communication circuit configured to transmit and receive a signal; and
at least one second probe device comprising a second probe to be connected to at least one second internal pad of each of the one or more second semiconductor chips and a second communication circuit configured to transmit and receive the signal to and from the first communication circuit, wherein
the first probe device comprises a first signal generation circuit configured to convert a signal captured from the first internal pad via the first probe into the signal which can be transmitted by the first communication circuit and the second communication circuit, and
the second probe device comprises a second signal generation circuit configured to return the signal received by the second communication circuit into a signal before being converted by the first signal generation circuit and provide the returned signal to the second internal pad via the second probe.

19. The test system according to claim 18, wherein
the second signal generation circuit converts a signal captured from the second internal pad via the second probe into the signal which can be transmitted by the first communication circuit and the second communication circuit, and
the first signal generation circuit returns the signal received by the first communication circuit into a signal before being converted by the second signal generation circuit and provides the returned signal to the first internal pad via the first probe.

\* \* \* \* \*